United States Patent
Casey et al.

(10) Patent No.: US 6,956,248 B2
(45) Date of Patent: Oct. 18, 2005

(54) SEMICONDUCTOR DEVICE FOR LOW VOLTAGE PROTECTION WITH LOW CAPACITANCE

(75) Inventors: Kelly C. Casey, Flower Mound, TX (US); Elmer L. Turner, Jr., Grapevine, TX (US)

(73) Assignee: Teccor Electronics, LP, Irving, TX (US)

( * ) Notice: Subject to any disclaimer, the term of this patent is extended or adjusted under 35 U.S.C. 154(b) by 0 days.

(21) Appl. No.: 10/460,585

(22) Filed: Jun. 11, 2003

(65) Prior Publication Data

US 2003/0209724 A1 Nov. 13, 2003

Related U.S. Application Data

(63) Continuation-in-part of application No. 09/958,987, filed as application No. PCT/US01/04906 on Feb. 15, 2001, now abandoned, which is a continuation-in-part of application No. 09/504,224, filed on Feb. 15, 2000, now Pat. No. 6,531,717, which is a continuation-in-part of application No. 09/260,328, filed on Mar. 1, 1999, now Pat. No. 6,084,253.

(51) Int. Cl.$^7$ .............................................. H01L 29/74
(52) U.S. Cl. ...................... 257/107; 257/112; 257/164; 257/168; 257/173
(58) Field of Search ................................ 257/107, 112, 257/164, 168, 173

(56) References Cited

U.S. PATENT DOCUMENTS

| | | |
|---|---|---|
| 3,359,657 A | 12/1967 | Hedberg |
| 3,975,664 A | 8/1976 | Baumbach .................... 317/66 |
| 4,021,837 A | 5/1977 | Hutson |
| 4,074,337 A | 2/1978 | Debortoli et al. ........... 361/124 |
| 4,086,648 A | 4/1978 | Hines et al. ................. 361/124 |
| 4,307,430 A | 12/1981 | Montalto et al. ........... 361/124 |
| 4,594,635 A | 6/1986 | Scheithauer et al. ......... 361/119 |
| 4,695,916 A | 9/1987 | Satoh et al. ................... 361/56 |
| 4,796,150 A | 1/1989 | Dickey et al. .............. 361/119 |
| 4,876,621 A | 10/1989 | Rust et al. ..................... 361/58 |

(Continued)

FOREIGN PATENT DOCUMENTS

| | | |
|---|---|---|
| EP | 0 472 405 A2 | 2/1992 |
| JP | 02087978 A | 3/1990 |

OTHER PUBLICATIONS

U.S. Appl. No. 09/504,224, filed Feb. 15, 2000, entitled, "Very Low Voltage Actuated Thyristor With Centrally-Located Offset Buried Region."
ST SGS–Thomson Microelectronics, Data Sheet p.p.1/8–8/8, Oct. 1997.
ST SGS–Thomson Microelectronics, Data Sheet SMP Trisil, date unknown.
Handwritten note by Jack L. Turner, Jr., depicting SGS–Thomson Low Voltage (10v) device, Mar. 1997.

*Primary Examiner*—Long Pham
(74) *Attorney, Agent, or Firm*—Chauza & Handley, LLP; Roger N. Chauza

(57) ABSTRACT

A semiconductor thyristor device that incorporates buried region breakdown junctions laterally offset from an emitter region. By spacing the buried regions around the emitter region, current carriers emitted from the buried regions are distributed over a large area of the emitter region, thereby providing a high current capability during initial turn on of the device. In order to achieve low breakover voltage devices, the buried regions are characterized with high impurity concentrations, with the breakdown junctions located near the surface of the chip. The low voltage thyristor device minimizes the area of high dopant concentration junctions, thus minimizing the chip capacitance and permitting high speed, low voltage signal operation.

37 Claims, 13 Drawing Sheets

U.S. PATENT DOCUMENTS

| | | | |
|---|---|---|---|
| 4,876,626 A | 10/1989 | Kaczmarek | 361/119 |
| 4,901,188 A | 2/1990 | Gilberts | 361/119 |
| 4,905,119 A | 2/1990 | Webb | 361/119 |
| 4,907,120 A | 3/1990 | Kaczmarek et al. | 361/119 |
| 4,939,619 A | 7/1990 | Borkowicz et al. | 361/117 |
| 4,944,003 A | 7/1990 | Meyerhoefer et al. | 379/412 |
| 4,958,253 A | 9/1990 | Gilberts et al. | 361/119 |
| 4,958,254 A | 9/1990 | Kidd et al. | 361/119 |
| 4,964,160 A | 10/1990 | Traube et al. | 379/412 |
| 4,967,256 A | 10/1990 | Pathak et al. | 357/38 |
| 5,001,537 A | 3/1991 | Colman et al. | 357/38 |
| 5,031,067 A | 7/1991 | Kidd et al. | 361/119 |
| 5,101,317 A | 3/1992 | Cwirzen et al. | 361/119 |
| 5,150,271 A | 9/1992 | Unterweger et al. | 361/119 |
| 5,155,649 A | 10/1992 | Hung et al. | 361/119 |
| 5,172,296 A | 12/1992 | Kaczmarek | 361/119 |
| 5,175,662 A | 12/1992 | DeBalko et al. | 361/119 |
| 5,224,012 A | 6/1993 | Smith | 361/119 |
| 5,296,646 A | 3/1994 | Capper et al. | 174/51 |
| 5,341,270 A | 8/1994 | Kaczmarek | 361/119 |
| 5,357,568 A | 10/1994 | Pelegris | 361/119 |
| 5,359,657 A | 10/1994 | Pelegris | 379/412 |
| 5,365,660 A | 11/1994 | Capper et al. | 29/884 |
| 5,371,647 A | 12/1994 | Fried et al. | 361/119 |
| 5,398,152 A | 3/1995 | Borkowicz et al. | 361/119 |
| 5,422,779 A | 6/1995 | Borkowicz et al. | 361/119 |
| 5,429,953 A | 7/1995 | Byatt | |
| 5,438,619 A | 8/1995 | Shannon et al. | 379/412 |
| 5,479,031 A | 12/1995 | Webb et al. | 257/173 |
| 5,490,215 A | 2/1996 | Pelegris | 379/412 |
| 5,500,377 A | 3/1996 | Flores et al. | |
| 5,523,916 A | 6/1996 | Kaczmarek | 361/119 |
| 5,643,014 A | 7/1997 | Filus et al. | 439/680 |
| 5,696,391 A | 12/1997 | Bernier | |
| 5,719,413 A | 2/1998 | Bernier | |
| 5,753,943 A | 5/1998 | Okabe et al. | |
| 6,084,253 A * | 7/2000 | Turner, Jr. | 257/107 |
| 6,262,443 B1 | 7/2001 | Ballon et al. | |
| 6,531,717 B1 * | 3/2003 | Casey et al. | 257/109 |

\* cited by examiner

SEMICONDUCTOR DEVICE FOR LOW VOLTAGE PROTECTION WITH LOW CAPACITANCE

RELATED APPLICATIONS

This patent application is a continuation-in-part of U.S. national stage application Ser. No. 09/958,987 filed Oct. 12, 2001, now abandoned, which claims priority to PCT international application PCT/US01/04906, filed Feb. 15, 2001, which international application is a continuation-in-part of pending U.S. application Ser. No. 09/504,224, filed Feb. 15, 2000, now U.S. Pat. No. 6,531,717, entitled "Very Low Voltage Actuated Thyristor With Centrally-Located Offset Buried Region", which is a continuation-in-part patent application of U.S. application Ser. No. 09/260,328, filed Mar. 1, 1999 now U.S. Pat. No. 6,084,253, issued Jul. 4, 2000, the entire subject matter of the applications and patent of which is incorporated herein by reference.

TECHNICAL FIELD OF THE INVENTION

The present invention relates in general to thyristors and other four-layer devices, and more particularly to the fabrication of thyristor devices having low breakover voltages.

BACKGROUND OF THE INVENTION

Thyristors, SIDACtor® overvoltage devices and other four-layer devices are commonly used to provide overvoltage protection to circuits requiring the same. The SIDACtor® overvoltage devices are two-terminal thyristors that have bidirectional current carrying capability. Such devices are obtainable from Teccor Electronics at many different breakover voltage values. When used in conjunction with telephone lines, for example, of the type in which 220-volt ringing signals are carried, a 250-volt breakover voltage SIDACtor® overvoltage device can be used to allow normal operation of the telephone line, but operate at 250 volts, or greater, in response to lightning strikes or power line crosses to thereby safely clamp the line to a very low voltage. This type of a device provides high surge current capabilities for protecting equipment from damage due to the extraneous voltages that may be coupled to the telephone line. Five-pin telephone line protection modules utilizing these high voltage devices have typically been commercially available.

Many telephone circuits and equipment operate on a 48-volt supply voltage. To that end, SIDACtor® overvoltage devices that operate at a nominal 64 volts are often used to protect such type of circuits. A nominally operating 30 volt SIDACtor® device can be advantageously used to protect many 24 volt circuits, such as fire alarm and other systems, that are susceptible to extraneous voltages. It can be appreciated that the lines that generally require protection from damage due to extraneous voltages are often in environments where energy from lightning strikes can be induced into the lines, where high voltage AC circuits are in close proximity thereto, and for a host of other reasons.

While low-voltage digital lines, such as those driven by 5-volt TTL drivers are extensively employed in computerized and other equipment, such lines have not yet found a large application in outside installations. However, in view of the fact that computer networks and communications are increasing at a substantial rate, such low-voltage lines are being used in environments where overvoltage protection is required. Such overvoltage protection need not be due solely to lightning and power line crosses, but can be due to other standard voltages that are commonly found in indoor equipment.

It is well known in the thyristor and SIDACtor® overvoltage device field that the impurity level of a semiconductor wafer can be adjusted to thereby achieve a desired breakover voltage. It is commonly known that lightly-doped silicon substrates are characterized by high breakover voltages. As the doping or impurity level of the substrate is increased, the breakover voltage is reduced. It is also well known that the impurity level of a semiconductor material is inversely proportional to the resistivity thereof.

It has also been found that the use of buried regions in the semiconductor substrate facilitates the operational characteristics of a SIDACtor® overvoltage device. See, for example, U.S. Pat. No. 5,479,031 by Webb. Referring to FIG. 1, if the SIDACtor® device is constructed so as to have an N-type emitter 18, a P-type base 16 and an N-type substrate 12 or mid-region, a heavily doped P-type buried region 14 can be implanted between the base region 16 and the silicon substrate 12 to thereby reduce the breakover voltage. Important advantages are achieved when the buried region 14 is directly beneath the emitter region 18, with the base region 16 material therebetween. Without significantly changing the impurity levels of the emitter 18, base 16 and substrate 12, the breakover voltage can be changed by simply changing the impurity level of the buried region 14. Moreover, in achieving breakover voltages from 250 volts down to 64 volts, the buried region need only be more heavily doped. In like manner, to achieve 30-volt breakover voltage devices, the buried region is required to be even more heavily doped.

As the impurity level of the buried region 14 increases, the junctions 20–26 formed between the buried region 14 and the base region 16 are displaced upwardly toward the emitter region 18. Indeed, as the doping level of the buried region 14 increases, the distance between the buried region-base junction 20 and the base-emitter junction becomes smaller and smaller. The reason for this is that the junction 20 is formed at a location in the semiconductor material where the donor states of one impurity are cancelled by the acceptor states of the opposite impurity. Stated another way, the junction of two semiconductor materials exists where the impurity concentration of one region is equal to the impurity concentration of the other region. The formation of a low breakover voltage SIDACtor® overvoltage device is not an elementary task.

It has been found that to fabricate nominal 10-volt breakover voltage SIDACtor® devices, the impurity level of the buried region must be so high that the buried region can often be effectively short circuited to the emitter region. In any event, even after fine tuning the processes so as to prevent short circuiting between the buried region and the emitter, the yield of workable devices is low, and thus such devices become costly.

Another problem attendant with upward migration of the junction of the buried region is that the base region under the emitter becomes thinner. The distance in the base region between the emitter junction and the buried region junction defines, in part, a holding current ($I_h$) parameter. The holding current is that current required to maintain an on-state of the device. A thinner base region adversely affects the ability to control a desired holding current.

Various other attempts have been made to make low breakover voltage thyristors. One endeavor involves a semiconductor design in which the breakover voltage occurs at the surface of the device. In other words, the concentration of the impurities at the surface of the device is controlled to achieve a low breakdown voltage.

Standard twisted pair telephone lines are protected by various circuits from hazardous voltages and currents that may be imposed on the lines. It is a standard practice to provide primary protection by the use of five-pin protection modules in the central offices and other high density conductor applications. Such modules have a standard pin configuration so that the modules of many different suppliers can be inserted into the same type of socket.

The basic protection to telephone lines includes primary protection modules and secondary protection modules. The primary protection module provides overvoltage protection against lightning strikes and power line crosses to the telephone lines. Such primary protectors may include gas discharge tubes and other semiconductor devices that can withstand high voltages. Secondary protection circuits often include semiconductor devices, resistors, positive temperature coefficient devices and other components to provide lower voltage protection to the customer side equipment. A family of overvoltage protection SIDACtor® devices providing the secondary protection is available from Teccor Electronics, Irving, Tex. The primary protection module is effective to limit the hazardous line voltages to approximately 300 volts. The secondary protection circuits, for example in line cards, provide additional protection to the telephone lines at levels below 300 volts.

While numerous five-pin primary protection modules are commercially available to provide primary protection, there is a limited selection of five-pin secondary protection modules providing secondary protection.

Recent changes in regulatory requirements suggest the use of DC isolation as well as overvoltage protection in secondary protection circuits of certain types of equipment. This imposes additional constraints not currently satisfied by currently available devices and circuits.

From the foregoing, it can be seen that a need exists for a method and technique to fabricate low breakover voltage thyristor devices. Another need exists for a technique to fabricate low voltage thyristor devices where the breakover voltage is independent of the holding current. Yet another need exists for a thyristor device which can be reliably made with high yields, thereby reducing the cost of the devices. Another need exists for a five-pin communication line protection module for use with low voltage communication lines. A further need exists for a low voltage thyristor device that exhibits a low voltage overshoot in response to fast rise time transients, and that exhibits a low device capacitance.

SUMMARY OF THE INVENTION

In accordance with the principles and concepts of the invention, there is disclosed a technique for fabricating low-voltage thyristor devices, which technique overcomes the disadvantages and shortcomings of the prior art.

In accordance with an edge-fired embodiment of the invention, the buried region is laterally offset from the emitter region. The upward movement of the buried region junction as a function of the impurity level does not thereby interfere or otherwise become too close to the emitter junction. In addition, because of the lateral displacement of the buried region from the emitter, the base region underlying the emitter does not vary in thickness as a function of the location of the buried region junction. This essentially makes the breakover voltage independent of the holding current value of the device.

In accordance with another feature of the invention, a deep base is provided to thereby make the mid-region of the substrate thinner. The mid-region of the substrate functions in the four-layer device as a base of one of the regenerative-connected transistors of the thyristor device. With a thinner transistor base, the gain of the device is higher, thereby increasing the operational speed of the thyristor.

In another embodiment, a four-layer thyristor is fabricated utilizing a pair of spaced-apart emitters with the buried region disposed therebetween.

In yet another embodiment, a low voltage thyristor device is formed as a center-fired device in which the buried region is formed offset from the emitter, but generally centered in the chip. This arrangement not only allows an increased device current to flow, but also facilitates assembly of the packaged device. By placing the buried region in the center of the semiconductor chip and utilizing two symmetrically oriented metal contacts, the chip self centers itself to a lead frame when reflow soldered thereto.

In yet another embodiment, a five-pin communication line protection module uses the low-voltage thyristor to provide low voltage line protection to other circuits, such as data systems.

According to another embodiment, high impurity concentration buried regions are used to not only achieve a low breakdown voltage, but the buried regions are constructed utilizing cross-sectionally small areas to reduce device capacitance. The device can thus be used for protecting lines carrying high speed digital signals. An additional feature of this embodiment is that the buried regions are formed at various locations with respect to the emitter region, such that full conduction over the entire emitter area is achieved faster, thereby reducing the voltage overshoot of the device. In accordance with a described embodiment, the emitter of the device is fabricated with a peripheral edge or perimeter having indentions or cutouts formed therein. Formed below such cutouts are corresponding buried regions. The location of the buried regions with respect to the emitter allow carriers emitted from the buried regions to flow to essentially the entire, if not all, of the emitter area, thereby providing full turn on of the emitter. This allows high current densities to be accommodated during turn on of the device without causing "bottle-neck" locations of the current.

BRIEF DESCRIPTION OF THE DRAWINGS

Further features and advantages will become apparent from the following description of the drawings, in which like referenced characteristics generally refer to the same parts, elements or functions throughout the views, and in which:

FIG. 29b is an enlarged cross-sectional view of a portion of the overvoltage protection device of FIG. 29a;

DETAILED DESCRIPTION OF THE INVENTION

Figure 2:
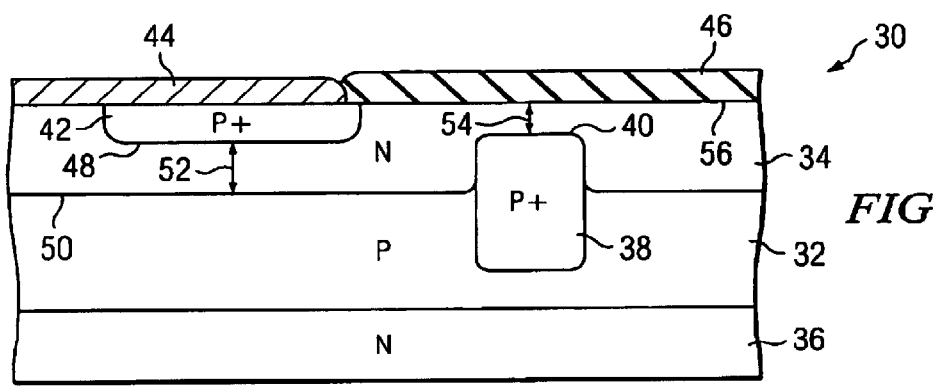
FIG. 2 is a cross-sectional view of a low voltage SIDACtor® device constructed in accordance with one embodiment of the invention.

FIG. 2 illustrates the principles and concepts of one embodiment of the invention. A single four-layer unidirectional device 30 is illustrated. Two such devices (a top surface and bottom surface device) can be formed in the semiconductor substrate to provide bidirectional current flow capabilities. The device 30 is formed in the top surface of a starting silicon substrate 32 of the P-type. Region 32 defines both the mid-region of the four-layer thyristor, and a base of a NPN transistor. An N-type base region 34 for one device is formed in the top surface of the wafer, and a second N-type base region 36 for a second device (not shown) is formed in the bottom surface of the wafer. A heavily doped buried region 38 is formed in the substrate 32, preferably by standard semiconductor diffusion techniques and before either base region 34 or 36 is formed. The buried region 38 is formed by diffusing boron atoms for about three days, resulting in a surface concentration of about $10^{19}$ atoms/$cm^3$, and at a depth of 80 microns. This impurity concentration at the top of the buried region 38 is effective to provide a breakover voltage in the range of 8–12 volts. The wafer undergoes the diffusion process at a temperature of about 1275° centigrade for about three days to activate the ions. After activation, a base junction 40 is formed between the buried region 38 and the base region 34. A P-type emitter region 42 is formed in the base region 34, but offset laterally from the buried region 38. A metal contact 44 is formed in electrical contact with both the emitter region 42 and the base region 34. On the semiconductor wafer overlying the buried region 38, there is formed a dielectric layer 46 of glass, oxide or other electrically insulating material.

Figure 1:
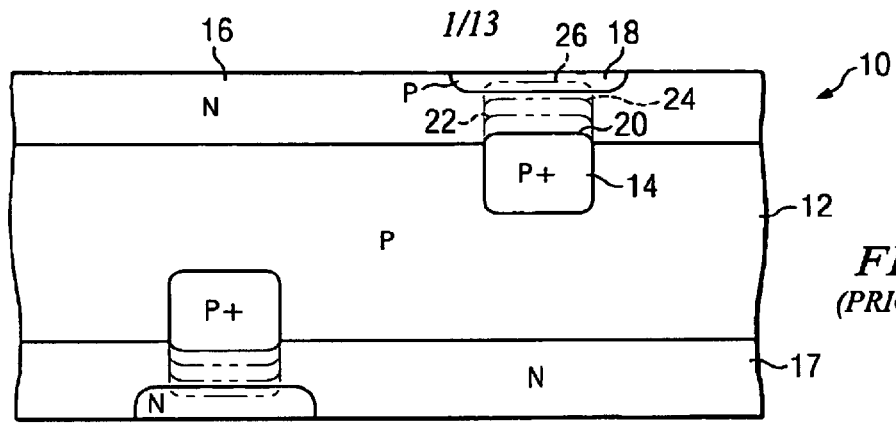
FIG. 1 is a cross-sectional view of a low breakover voltage SIDACtor® device constructed in accordance with the prior art.

As can be seen from FIG. 2, the buried region 38 does not underlie the emitter region 42. Rather, the buried region 38 is offset so that the base junction 40 with the base region 34 does not come into close vertical proximity to the emitter-base junction, even when the base junction 40 becomes increasingly shallow as the buried region 38 becomes more heavily doped. Indeed, even when the base junction 40 becomes extremely shallow due to the heavy doping of the buried region 38, there is no possibility that it would short circuit with the emitter-base junction. The arrangement of the semiconductor regions of FIG. 2 defines an edge fired thyristor device, in that the buried region 38 is located near the edge of the chip. The buried region associated with the companion unidirectional device (not shown) in FIG. 2 would be located near the bottom left of the chip, much like the positions of the buried regions shown in the prior art device of FIG. 1.

The holding current $I_h$ of the device 30 is a function of the distance 52 between the emitter-base junction 48 and the base and mid-region junction 50. As can be appreciated, the distance 52 is independent of the location of the base junction 40.

The breakover voltage ($V_{BO}$) of the device 30 is primarily a function of the impurity concentration of the buried regions 38 of. In addition, and as noted above, the distance 54 between the base junction 40 and the upper surface 56 of the semiconductor wafer also determines the breakover voltage characteristics of the device 30. In accordance with an important feature of the invention, the breakover voltage of the device 30 is determined, in part, by the distance 54, which is independent of the holding current characteristics.

The holding current characteristics are determined primarily by the distance 52. Not only can a high impurity concentration buried region 38 be used without the attendant problem of short circuiting with the emitter-base junction 48, but the device made according to the invention renders the breakover voltage characteristics independent of the holding current characteristics.

As noted above, an insulating dielectric 46 overlies the buried region 38. The reason for this is that when the device is subjected to an overvoltage, initial breakdown occurs as current flows from the bottom base region 36 to the emitter region 42, via the buried region 38. With multiple buried regions, multiple current paths are initially formed, thereby providing a high surge current capability. To force the initial current during breakdown to pass under the emitter region 42 and through the metal contact 44, the base region above the buried region 38 is covered with the insulator 46. Otherwise, if the metal contact 44 extended over the buried region 38, current would bypass the emitter region 42 and pass directly to the metal contact 44. Once the current through the device 30 reaches the switching current ($I_s$), the on-state of the device is maintained and current flow need not pass through the buried region 38. It can be appreciated from the foregoing that the lateral distance between the emitter region 42 and the buried region 38 should be small to increase the turn-on speed of the device, as well as to reduce the initial overshoot during turn on. In the fabrication of a bidirectional SIDACtor® device, two devices (one shown in FIG. 2) can be used, one formed in the top surface of the substrate, and the other device formed in the bottom surface.

Figure 3:
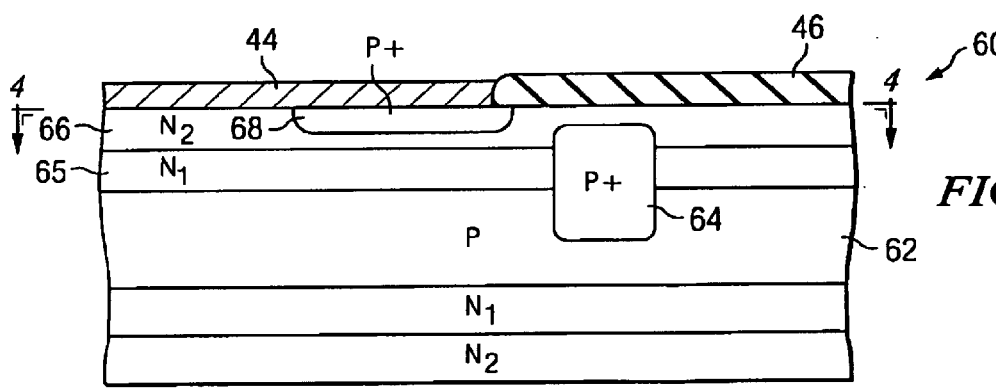
FIGS. 3 and 4 are respective cross-sectional and top views of yet another embodiment of a low voltage SIDACtor® device having a deep base region to effectively make the mid-region of the substrate thinner, thereby increasing the operational speed of the device.
Figure 4:
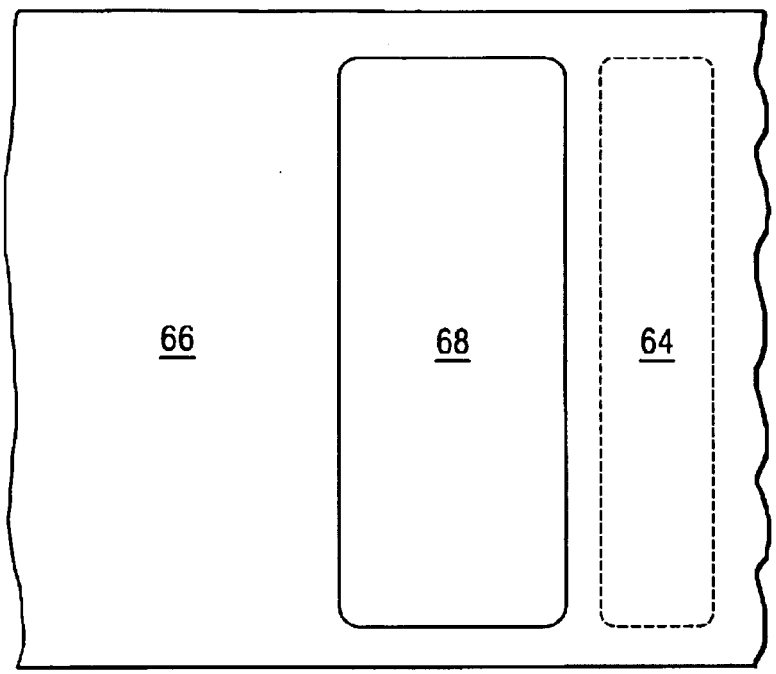

FIG. 3 illustrates another embodiment 60 of the invention having double base regions formed on the top surface of the substrate, and double base regions formed on the bottom surface of the substrate. In the example shown, the substrate or mid-region 62 is employed, and one or more buried regions 64 are formed therein in the manner noted above with reference to FIG. 2. A first thick base region 65 is formed in the top surface of the substrate, and doped with an N-type impurity to achieve an 8–15 ohm per square resistivity. A second thinner base region 66 is formed in the first base region 65. The base region thicknesses are not shown to scale in the drawings. The second base region 66 is formed at a higher N-type impurity level at the surface of about $3 \times 10^{19}$ atoms/cm$^3$. The heavily doped N-type base region 66 and the heavily doped P-type buried region 64 allow a junction to be formed therebetween. In the top base 66 there is formed a P-type emitter region 68. Again, the buried region 64 is laterally offset with respect to the emitter region 68, thereby making the breakover voltage characteristics independent of the holding current characteristics. In addition, by utilizing a double base region in the top and bottom surfaces of the substrate 62, the mid-region 62 is thereby effectively narrowed. The P-type mid-region 62 corresponds to the base of an NPN transistor which forms one-half of the thyristor device. By making the mid-region 62 thinner, and thus the base region of the NPN transistor thinner, the gain of the device is improved and the initial breakover characteristic is improved to reduce the turn on time. FIG. 4 is a top view of the device 60, taken along line 4—4 of FIG. 3.

Figure 5:
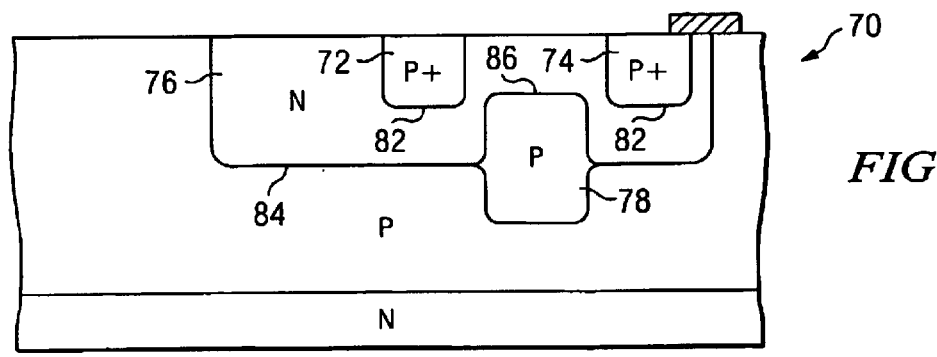
FIGS. 5 and 6 are respective cross-sectional views of a low voltage SIDACtor® device utilizing a buried region disposed between emitter regions.
Figure 6:
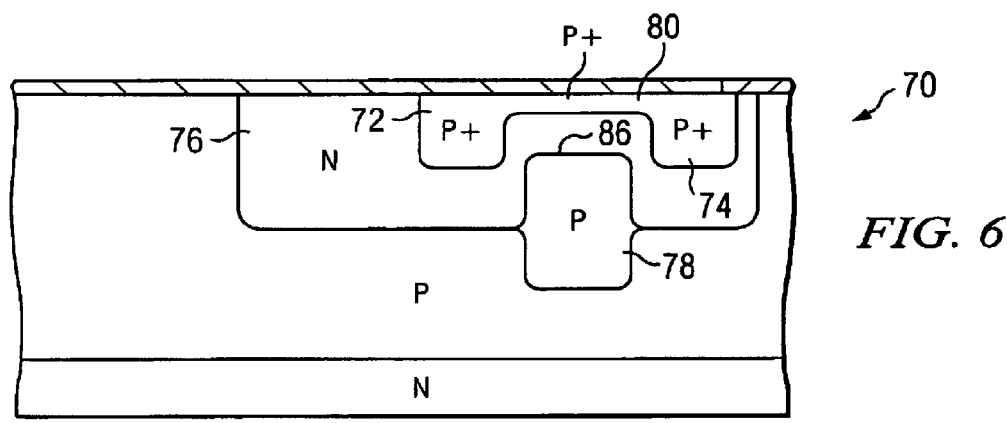

FIGS. 5 and 6 illustrate another embodiment of a thyristor device 70 in which the emitter configuration is modified. Here, a pair of spaced-apart P-type emitters 72 and 74 are formed in the N-type base region 76. Indeed, each emitter region 72 and 74 is spaced on each side of the buried region 78. As noted in the next step of the process shown in FIG. 6, additional P-type impurities are diffused into the top surface of the base region to form a bridge 80 that thereby short circuits the emitters 72 and 74 together. The bridge 80 should be sufficiently thin to maintain a separation with the junction 86 of the buried region 78. The bottom surface of the junction 82 of each emitter region 72 and 74 can thus be formed as close to the junction 84 as necessary, to improve the gain and turn-on characteristics of the device. Again, the distance between the junction 82 and the junction 84 is independent of the location of the junction 86 formed at the top of the buried region 78.

Figure 7:
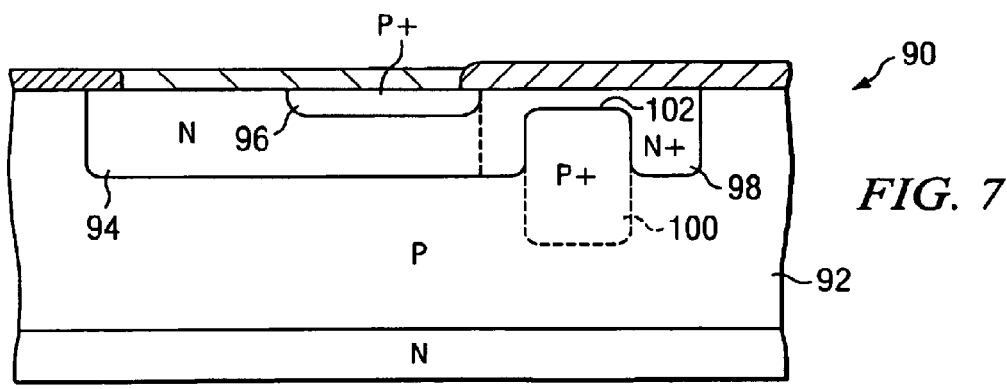
FIG. 7 is a cross-sectional view of a low voltage SIDACtor® device utilizing a base region that has a portion thereof that is lightly doped for improved turn-on performance, and a more heavily doped portion of the base region to control the breakover voltage.

With reference now to FIG. 7 there is illustrated another embodiment 90 of the invention. Here, there is shown a P-type mid-region 92, an N-type base region 94 and a P-type emitter 96 formed therein. The first base region 94 is lightly doped and underlies the emitter region 96. Disposed laterally at the side of the emitter 96 is a more heavily doped second base region 98. A buried region 100 forms a base junction 102 in the heavily doped second region 98. Since the more heavily doped base region 98 does not underlie the emitter region 96, the turn on characteristics of the device are not substantially affected. With this arrangement, the breakover voltage can be reduced further, thus providing overvoltage protection to low voltage communication lines.

Figure 8:
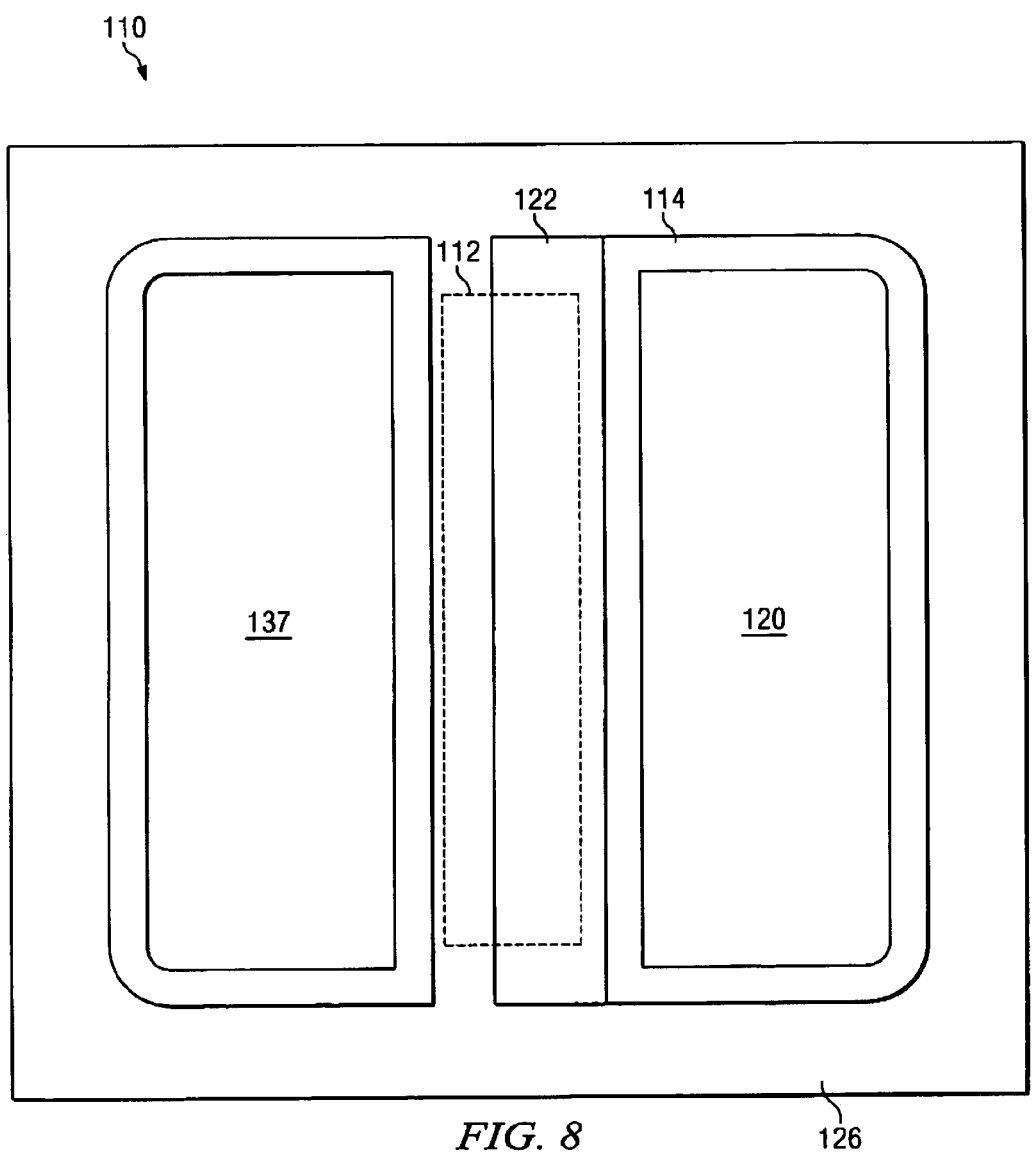
FIGS. 8 and 9a are respective top and sectional views of yet another embodiment of the invention, in which the device is considered a "center-fired" device in that the buried region is centrally located in the semiconductor chip.
Figure 9A:
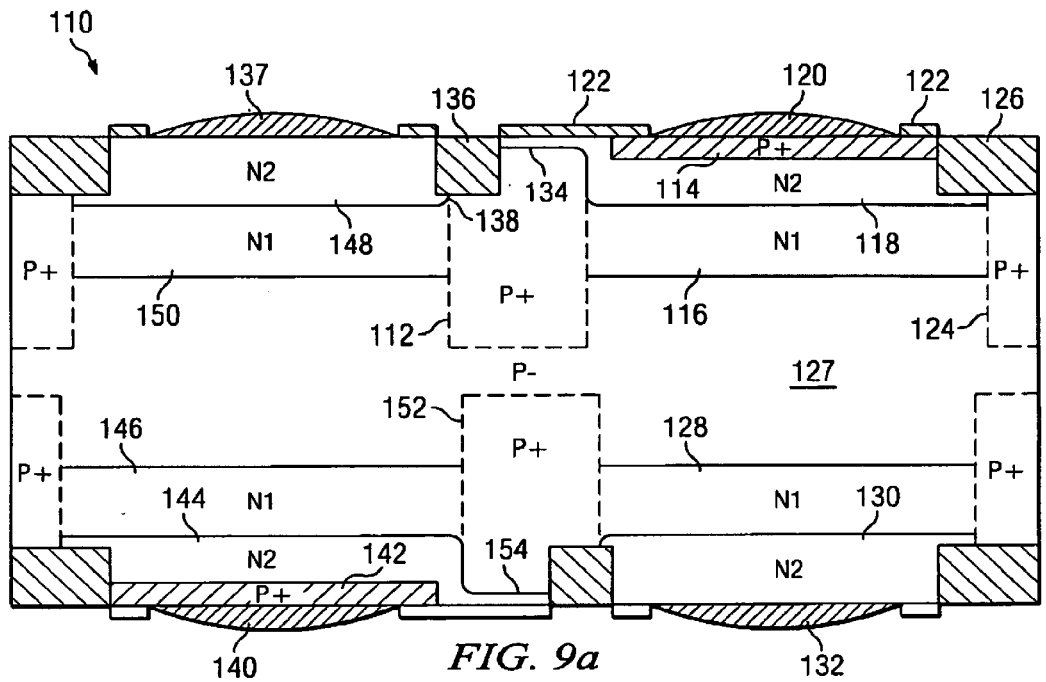

Another embodiment of the invention is shown in FIGS. 8 and 9a. This thyristor device 110 also includes a buried region 112 that is laterally offset with respect to an emitter region 114. Rather than placing the buried region 112 near an edge of the chip, the buried region 112 is located generally in the central portion of the chip. As will be described in more detail below, the center-fired design allows the metal contact areas to be larger, thereby providing a larger current-carrying capability. Two symmetrically-oriented surface contacts are located on each side of the wafer, thereby allowing easier centering of the device within a lead frame during assembly of the packaged device.

The thyristor device 110 shown in FIGS. 8 and 9 includes a first base region 116 and a second base region 118, providing the same advantages noted above in connection with the embodiment of FIG. 3. A metal cathode contact 120, such as solder, is formed in electrical contact with the emitter region 114. The solder contact 120 is bounded by silicon oxide 122. Formed at the same time as the central buried region 112 is another buried region 124 formed at the edge of the chip. The buried region 124 functions to terminate the junction of the two base regions 116 and 118. An insulating material, such as glass 126, formed in a trench serves to prevent the edge-located buried region 124 from initiating conduction of carriers toward the emitter 114. Rather, electron conduction is initiated through the central buried region 112.

One unidirectional device of the thyristor involves the central buried region 112, the emitter 114, the upper two base regions 116 and 118, the mid-region 127, as well as the lower two base regions 128 and 130. A lower metal contact 132 functions as the anode to the first unidirectional device of the thyristor 110. Assuming the thyristor 110 is biased so that the cathode contact 120 is positive with respect to the anode contact 132, electron current flows from the anode 132 through the bottom base regions 128 and 130, through the mid-region 127 and into the central buried region 112. Initial electron current does not flow directly through the upper base regions 116 and 118, but first through the central buried region 112. From the top junction 134 of the buried region 112, electrons flow into the upper N2 base region 118 and into the emitter region 114, whereupon thyristor conduction begins. Current flows from the emitter region 114 and out of the cathode contact 120. Once conduction is initiated by way of the central buried region 134, current thereafter flows directly from the mid-region 127 through the upper N1 and N2 base regions 116 and 118 into the emitter region 114.

The glass-filled trench insulation regions 126 and 136 function to prevent initiation of current flow, except through the central buried region junction 134 to the emitter region 114. The glass-filled trench 136 prevents initial electron current from flowing through the central buried region 112 into a metal anode contact 137 formed in the top surface. This is because the breakdown voltage of the top junction 134 of the central buried region 112 is lower than the breakdown voltage at the side junction indicated by reference numeral 138. The breakdown voltage of the side junction 138 of the buried region 112 under the glass 136 is greater than that of the top junction 134. The reason for the difference in breakdown voltages is that the impurity concentration of the buried region 112 at the side junction 138 is less than that at the top junction 134. As noted above, the heavily doped central buried region 112 is formed by a long-term diffusion process which naturally results in an impurity concentration gradient between the upper and lower portions of the central buried region 112. According to the diffusion process, the impurity concentration of the upper part of the central buried region 112 is greater than the impurity concentration located therebelow. With a lower impurity concentration at the side junction 138, the breakdown voltage is naturally higher than that at the top junction 134. As a result, the top junction 134 of the central buried region 112 reaches breakdown first, whereupon initial electron current flow is through the top of the central buried region 112 to the emitter region 114. The same principle operates in conjunction with the edge buried region 124 and the glass-filled trench 126. It is noted that the depth of the glass-filled trench boundaries 126 and 136 are formed at the same depth. Indeed, the insulating glass 126 and 136 are formed about the periphery of the device, and formed at the same time in a single peripheral trench.

In the event it is desired that a higher switching current be achieved in the device, the depth of the glass 136 can be less, thereby raising the upper edge of the side junction 138, thus reducing the breakdown voltage at that location. With a lower breakdown voltage, some current tends to pass from the central buried region 112 into the left N2 region 148 and out the metal anode contact 137. As will be described more fully below, the top metal contacts 120 and 137 are short circuited together by a lead frame, and the lower contacts 132 and 140 are short circuited together by another lead frame.

The other bidirectional device of the thyristor 110 includes a bottom emitter 142 in contact with the bottom cathode contact 140. The two lower base regions 144 and 146 are associated electrically with the emitter region 142. The upper two base regions 148 and 150 are associated with the anode contact 137. Current flow in the second bidirectional device is from the anode contact 137 to the cathode contact 140. As with the other unidirectional device described above, initial electron current flows from the anode contact 137 through the two upper base regions 148 and 150, through the mid-region 127 and into the lower, central buried region 152. Electron current flows out of the bottom-most junction 154 of the buried region 152, through the heavily doped lower base region 144 and into the emitter 142. Once conduction is initiated, current does not pass through the buried region 152, but rather through the lower base regions 144 and 146 into the emitter region 142 and out of the cathode contact 140. The various insulator glass and silicon oxide regions shown formed in the bottom of the semiconductor chip 110 provide the same function as those described above in connection with the top of the semiconductor chip 110. As can be appreciated, if the overvoltage to which the thyristor device 110 is subjected is an AC signal, then the unidirectional devices will conduct alternately based on the positive and negative cycles of the AC signal.

Figure 9B:
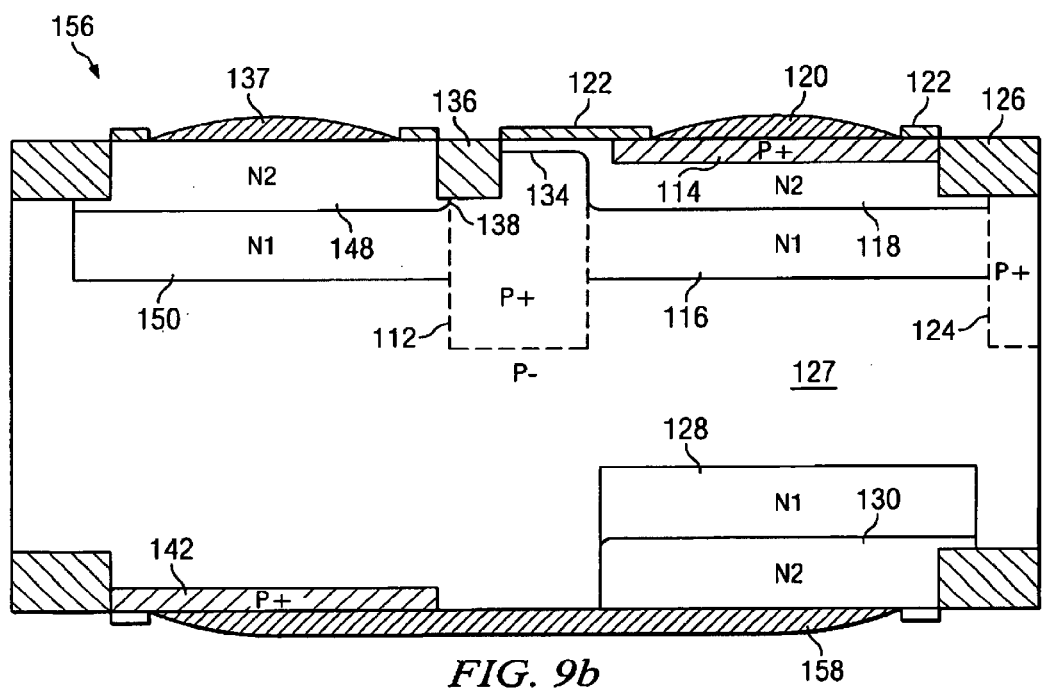
FIG. 9b is a cross-sectional view of another embodiment of the invention with semiconductor areas formed so that the entire device functions as a low voltage Zener diode.

FIG. 9b illustrates an embodiment of the invention that functions in a manner similar to a low voltage Zener diode. The semiconductor regions formed in the right-most part of the semiconductor chip 156 function in the same manner noted above to produce an overvoltage protection device when a negative voltage is applied to the bottom contact 158 and a more positive voltage is applied to the top contact 120. When the voltage applied across the device is reversed, the semiconductor regions on the left function as a diode bridged across the other unidirectional device. The N-type regions 148 and 150 together with the P-type regions 127 and 142 define the diode. In this embodiment, only a single bottom contact 158 is necessary.

Figure 10:
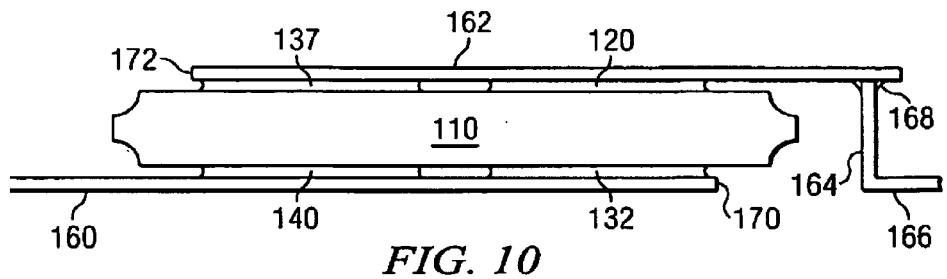
FIG. 10 is a side view of a thyristor device soldered to lead frame members.

FIG. 10 is a side view of the thyristor device 110 as assembled in connection with a first lead frame 160 and a metal preform 162. As can be seen, the top cathode contact 120 and top anode contact 137 are soldered to the top preform 162, and thus short circuited together. In like manner, the bottom anode contact 132 and bottom cathode contact 140 are soldered to the bottom lead frame 160 and are thereby short circuited together. The top preform 162 is soldered to an up-turned end 164 of a second lead frame 166. The joint 168 between the second lead frame 166 and the preform 162 is reflow soldered at the same time as the solder contacts of the thyristor device 110 are reflow soldered to the respective preform 162 and first lead frame 160. Due to the surface tension inherent in the liquified solder, the edge 170 of the first lead frame 160 tends to become self-aligned with the edge of the bottom anode contact 132. Similarly, the edge 172 of the preform 162 tends to become self aligned with the edge of the soldered anode contact 137. This self centering of the thyristor device with respect to the first lead frame 160 and the preform 162 helps prevent misalignment of the device with respect to the lead frames and thus increases assembly yield of the resulting semiconductor structure. Were it not for the symmetry between the edges of the various solder contacts of the thyristor device 110 and the lead frames, registration of the components would be more difficult. In the event that the thyristor device 110 becomes misaligned with the lead frames, the assembly will not correctly fit into the mold for final packaging and encapsulation of the device.

As noted above, another advantage of the symmetry between the top solder contacts 120 and 137 and the bottom solder contacts 132 and 140 is that larger area contacts can be formed to thereby facilitate increased current capability of the device. This symmetry can be achieved because the buried regions 112 and 152 are formed in vertical alignment. In practice, it has been found that the effective conduction area of the metallized emitter of FIG. 2 was about 883 square mils (0.57 mm$^2$), whereas the corresponding area of both top contacts of the embodiment shown in FIG. 8 is about 1,111 square mils (0.72 mm$^2$).

Figure 11:
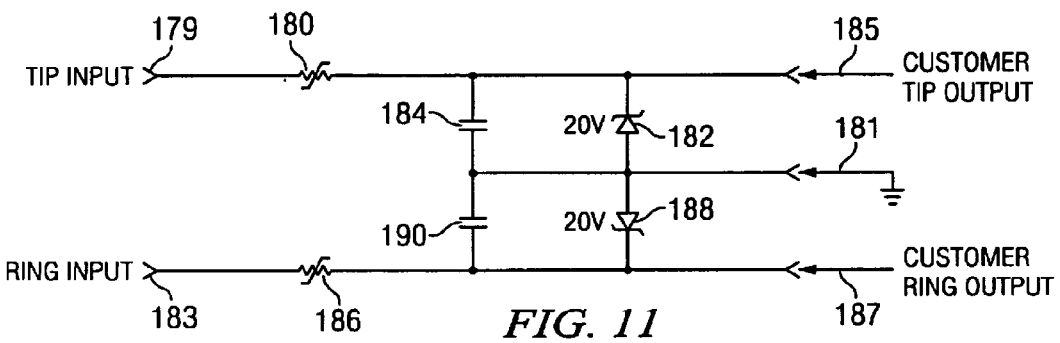
FIGS. 11 and 12 are respective circuit diagrams of low voltage communication line protection circuits.

FIG. 11 illustrates a five-pin, low voltage communication line protection circuit for providing twenty volt protection to circuits (not shown) connected to the customer tip and ring conductors. The protection circuit is useful in providing low voltage protection to telephone signaling lines that are typically employed to report alarms and the status of banks or series of printed circuit cards. These signaling lines constitute private communication channels used to communicate between a central office and remotely located terminals or cabinets. Such lines are not powered by the standard 48 volt supply but rather are low voltage operating circuits.

The tip conductor 179 is connected in series with a positive temperature coefficient (PTC) element 180 to the customer tip conductor 185. The PTC element 180 produces about 4–10 ohms resistance up to about 300 ma flowing therethrough. Should the tip line current increase, the resistance of PTC element 180 increases to provide overcurrent protection to the customer side circuits. When the tip line current is reduced, the resistance of the PTC element 180 returns to its original value. Bridged between the customer tip conductor 185 and ground 181 is a twenty-volt Zener diode 182. A small value capacitor (470 pF) 184 functions to filter, condition and stabilize the signal line. The outside ring conductor 183 is similarly situated, in that it is connected in series with a PTC element 186 to the customer ring conductor 187. A second Zener diode 188 provides twenty volt protection to the customer ring equipment. The Zener diodes 182 and 188 can be of the type shown above in conjunction with FIG. 9b. A capacitor 190 provides the same function to the ring conductor 183 as capacitor 184 provides to the tip conductor 179.

While the low voltage protection circuit of FIG. 11 uses Zener diodes 182, 188, the four-layer devices described above in connection with FIGS. 1–9a can be used with equal effectiveness in place of the Zener diodes 182, 188. Zener diodes can be fabricated by maintaining only a single unidirectional device as described above in connection with FIG. 9b, and replacing the other unidirectional device with an effective PN junction. Those skilled in the art can readily appreciate the manner in which the various semiconductor regions can be modified by masking and diffusion techniques to provide a diode in parallel with the other unidirectional thyristor device.

When packaging or otherwise implementing the circuit of FIG. 11 in a module, it is not necessary to use the entire circuit. Rather, when it is desired to protect only the customer tip conductor 185 from hazardous voltages appearing on the outside tip conductor 179, then the capacitor 190 and Zener diode 188 can be omitted. Only a three-pin module may be necessary in this instance to provide protection to one line or conductor. The converse is also true if hazardous voltage protection is necessary to only the customer ring conductor 187.

Figure 12:
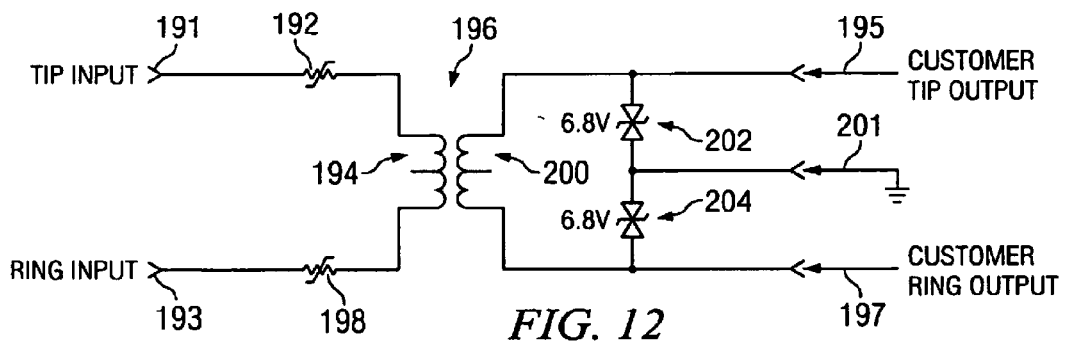

FIG. 12 illustrates yet another embodiment of a low voltage protection circuit that uses a transformer 196. Such an arrangement can be employed for connection to standard T1 or E1 digital transmission, or many other types of lines. In this embodiment, the tip conductor 191 is connected through a PTC element 192 through the primary 194 of the transformer 196. The other terminal of the transformer primary 194 is coupled through another PTC element 198 to the ring conductor 193. The transformer secondary 200 has one terminal connected to a customer tip conductor 195, and another terminal connected to a customer ring conductor 197. Connected between the customer tip conductor 195 and ground 201 is a back-to-back Zener diode arrangement 202 providing bidirectional protection in the neighborhood of about 6.8 volts to the customer tip conductor 195. A second bidirectional Zener diode arrangement 204 is coupled between the customer ring conductor 197 and ground 201 to provide bidirectional protection to the customer ring conductor 197.

The transformer 196 is effective to block any DC voltage that may exist on the tip and ring conductors from entering the customer circuits. Some T1 and E1 transmission lines can be powered by 130 volt or 48 volt supplies. The transformer prevents such DC voltages from being coupled to the lower operating voltage equipment of the customer. However, any AC voice, pulse or other similar types of signals are able to be transferred from the transformer primary 194 to the transformer secondary 200 and coupled to the customer circuits. The electrical isolation and other parameters provided by the transformer 196 may be of the type satisfying the recognized standards of UL 497A, CSA C22.2 NO. 950-95 and UL 1950 (3rd edition).

The line conditioning and protection circuit of FIG. 12 is well adapted for those situations where the outside line conditions are not well identified or known, and where the protection of the inside or customer circuits is important. For example, where there may be numerous lines incoming from various destinations and different applications where the electrical properties, operating conditions and characteristics of the lines may not be known, the protection module or circuit of FIG. 12 can be used to isolate all external DC voltages from the customer circuits but still allow the AC information to be transferred. The interfacing of the many outside lines to the customer circuits can be achieved by utilizing a bank of five-pin sockets, where each socket has pins connected to the outside lines, the customer lines, and a ground connection. A module with a protection circuit such as described above can be plugged into the socket to provide the type of protection desired. If different lines require different types of electrical protection, then a module with a different circuit therein can be used. The modules can be color coded or otherwise visually distinguished to identify the different circuits therein.

The modularized line conditioning and protection circuits can facilitate compliance with new or modified standards and specifications. In those situations where there already exists the primary and secondary protection circuits, the circuits shown in FIGS. 11 and 12, and yet other circuits, can be incorporated with the existing protection circuits to establish compliance with the new standards or specifications. The integration of the new protection circuits can be facilitated by incorporating the same into modular form adapted for plugging into standardized sockets. The adaptation of the new circuits can even be achieved in these instances by incorporating the standard secondary protection circuits with the new conditioning and protection circuits into the same module, and plug such module into the socket that previously held the standard secondary protection module. This feature allows the incorporation of the new protection scheme without having to wire, rewire or make connections to the existing communication lines.

Figure 13:
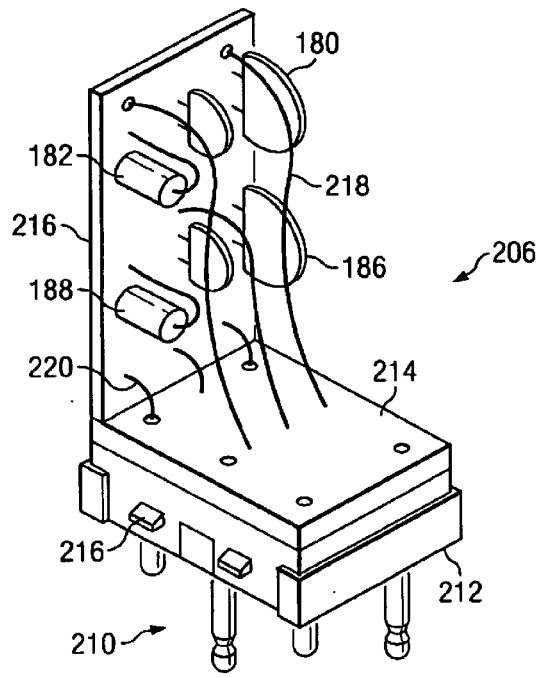
FIGS. 13 and 14 are five-pin protection modules embodying the respective low voltage protection circuits shown in FIGS. 11 and 12.

The low voltage protection circuits of FIGS. 11 and 12 can be incorporated into five-pin modules for easy use and plugability into customer communication interface equipment. With reference to FIG. 13, there is illustrated the telephone line protection circuit of FIG. 11 assembled in a five-pin module structure 206. The five pins 210 of the module are arranged in a standard configuration well known in the art. The pins 210 are fixed within a plastic molded base 212. A first printed circuit board 214 has conductive paths soldered to the respective pins 210. A second printed circuit board 216 is fabricated to hold the electrical components shown in FIG. 11. Various wire conductors 218 and 220 serve to connect the various conductors of the second printed circuit board 216 to the first printed circuit board 214 so that the circuit configuration operates electrically as shown in FIG. 11. The conductors 220 also support the second printed circuit board 216 vertically with respect to the first printed circuit board 214. A plastic molded cover 222 (FIG. 15) is molded to snap fit to the base 212 by way of the small openings 224 formed in the cover. The openings 224 are snap fit around corresponding bosses 216 extending from sides of the module base 212. As noted above, the Zener diodes 182 and 188 can be used as the low voltage thyristor devices described above, and packaged in diode-shaped packages. Other package configurations, including the well-known TO style packages can be easily soldered to the printed circuit boards.

Figure 14:
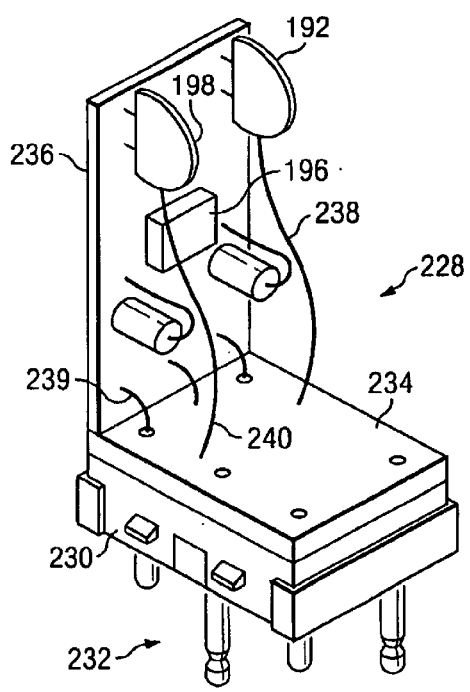

With reference now to FIG. 14, there is illustrated a five-pin module 228 incorporating the components of the low voltage protection circuit of FIG. 12. Again, there is a standard configuration five-pin molded base 230 to which the five pins 232 are fixed. A first printed circuit board 234 has conductive paths soldered to the respective pins 232. A second upright printed circuit board 236 is wired to the first printed circuit board 234 by a number of wire conductors 238 and 239. One terminal of each PTC element 192 and 198 is connected to the respective conductive paths of the second printed circuit board 236, while the other respective terminals 238 and 240 are connected directly to the first printed circuit board 234. The various printed circuit board conductive paths and components shown in FIG. 14 are arranged to provide the functions of the electrical circuit shown in FIG. 12.

Figure 15:
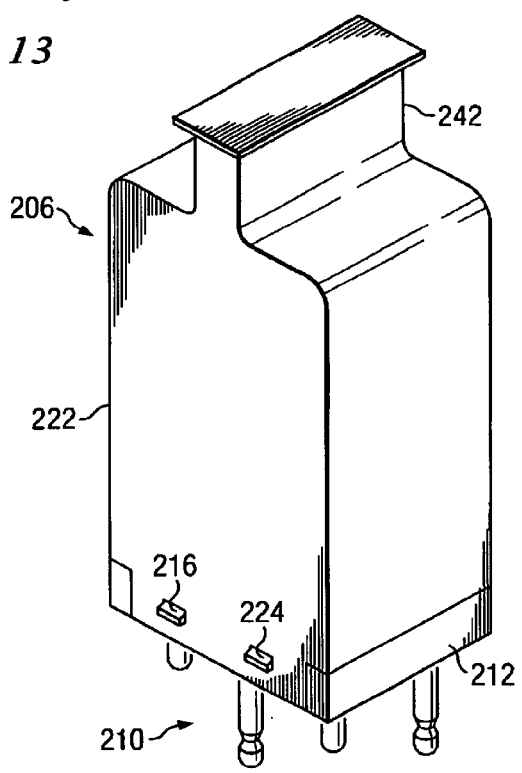
FIG. 15 is an isometric view of a five-pin protection module utilizing low-voltage protection circuits.

FIG. 15 illustrates a completed low voltage five-pin protection module 206 that may house the components of either circuit shown in FIG. 13 or FIG. 14. A finger-grip handle 242 molded as part of the cover 222 permits easy installation or replacement of the low voltage protection circuits in the customer equipment racks. The standard five-pin module configuration can be used to provide low voltage protection to various types of customer equipment that operates with low voltage signals carried on the lines. Indeed, the low voltage protection circuits and devices described above need not provide protection to voltages to which standard twisted pair telephone lines may be exposed, but rather to other digital and low-level signal lines that may never be exposed to lightning or power line voltages. Rather, many types of digital and analog communication lines may require protection from inside power sources, such as DC or AC power supplies which may be inadvertently coupled to the customer equipment, or where other circuits fail and allow damaging voltages between 5–50 volts to be coupled to the customer equipment. The various devices, circuits, modules and combinations thereof can be adapted for use with these and many other applications.

FIGS. 16–20 illustrate yet another embodiment of the invention, where plural buried regions are selectively located at different sites in the overvoltage protection device 250, thereby allowing current carriers to quickly migrate to substantially the entire surface area of the emitter region 258 during initial turn on of the device 250. In the fabrication of the device 250 according to this embodiment, a silicon wafer uniformly doped with a P-type impurity is used as the starting semiconductor material. The starting silicon material forms a mid-region 252 of the device 250. Those skilled in the art may prefer to use a starting silicon wafer of an N-type, in which event the polarities of the various semiconductor regions described below would be reversed.

The P-type silicon mid-region 252 is then masked to define circular openings for forming the various buried regions deep into the mid-region 252. In accordance with an important feature of the invention, the number of buried regions formed within the silicon material corresponds generally to the area of the emitter region 258. For larger emitter regions in terms of lateral area, either larger area buried regions or more buried regions may be used. While the use of many buried regions may increase the turn-on speed of the device, the overall capacitance of the device is also increased. A compromise must generally be made between the turn-on speed of the device, and the capacitance of the device.

In one embodiment, the device 250 is formed on a square semiconductor chip having an area of about 75.0 mils square. The area of the emitter region 258 is about half the area of the device 250. In any event, each current-carrying device on the chip using this configuration is fabricated with four buried regions. Two buried regions 254 and 256 are formed somewhat adjacent to each other, close to the outside edge of the chip, adjacent to and laterally offset with respect to the emitter region 258. Importantly, the breakdown junction of each buried region is formed laterally offset from the emitter region. The breakdown junction of the buried regions means the portion of the junction that generally defines the breakover voltage of the overvoltage protection device.

Two other buried regions 260 and 262 are formed further apart, adjacent the opposite edge of the emitter region 258. The buried regions 260 and 262 are formed adjacent two respective corners of the emitter region 258. As will be described more thoroughly below, this pattern or location of buried regions enhances the turn-on speed of the device 250 and thus lowers the voltage overshoot. This is critically important in the fabrication of overvoltage protection devices having low breakover voltage characteristics, namely fifty volts and below. As noted above, such type of overvoltage protection devices are useful in protecting digital or other low-voltage telecommunication lines or conductors.

Figure 17:
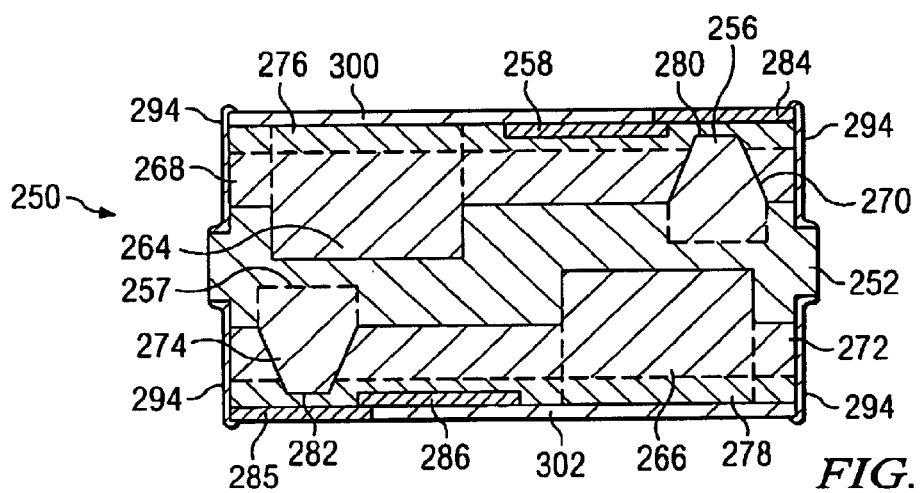
FIG. 17 is a cross-sectional view of the device of FIG. 16, taken along line 17—17 thereof.
Figure 18:
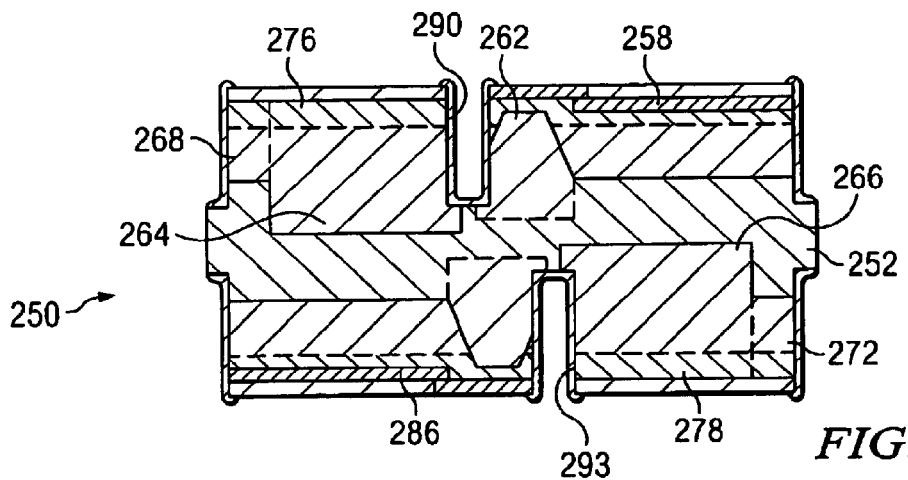
FIG. 18 is a cross-sectional view of the device of FIG. 16, taken along line 18—18 thereof.

With reference now to FIGS. 17 and 18, the wafer is masked on both sides thereof to form openings in which a well or tub of N-type impurities are diffused. N-type impurities such as phosphorus can be used. The n-wells 264 and 266 are formed directly underlying surface locations at which the respective emitter regions will be formed. The respective top and bottom wells 264 and 266 function to reduce the effective thickness of the mid-region 252 and increase the switching speed of the device 250. With a thinner mid-region, the forward turn-on voltage of the device is reduced.

Figure 16:
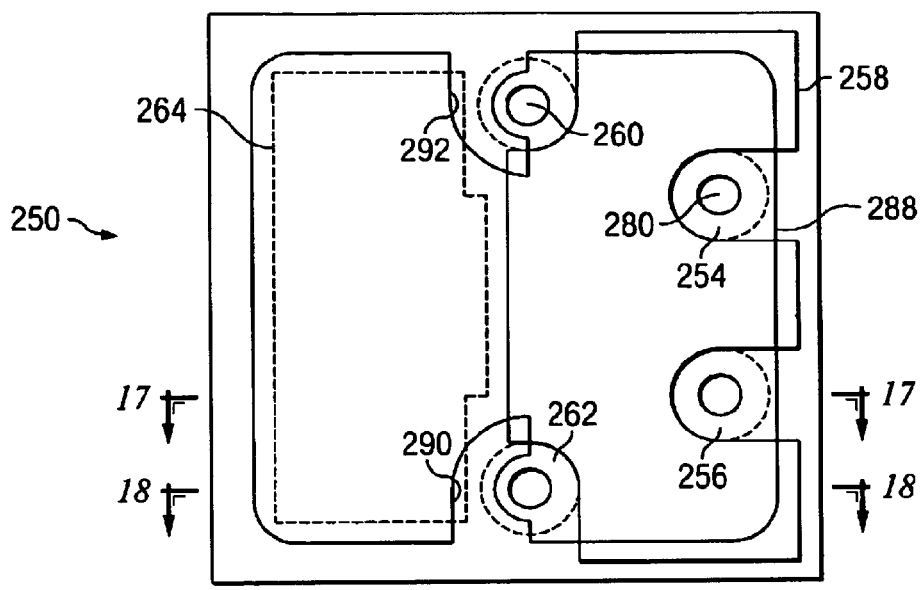
FIG. 16 is a top view of another embodiment of the invention, showing the features of the individual buried regions, as well as the location of the buried regions with respect to the emitter.

The openings in the mask for forming the buried regions 254, 256 and 260, 262 are circular in shape and located in the positions shown in FIG. 16. In the processing of a wafer having many chip areas thereon, the various masking and deposition steps are carried out on both sides of the wafer at the same time. The mask opening forming each buried region has a radius of about 2.0 mils. A P-type impurity is deposited on the wafer, in the openings, with a concentration sufficient to achieve the desired breakdown voltage suitable for protecting lines on which digital signals are transmitted. In order to achieve a breakover voltage of about ten volts, a P-type impurity, such as boron, is deposited to substantially a saturation level. Next, the boron atoms are driven deeply into the wafer from both sides thereof to a depth of about 3.0–3.5 mils, as shown in FIGS. 17 and 18. The deep buried regions are formed by subjecting the wafer to a temperature of about 1275° C. for about 72 hours. It can be appreciated that both sides of the wafer are processed at the same time to form buried regions in the shape and location as noted in FIGS. 16–18. The device 250 has formed therein one overvoltage protection device (with four buried regions) for conducting current in one direction, and a counterpart overvoltage protection device (with four other buried regions) for conducting current in the opposite direction. The processing steps and the geometry of each overvoltage protection are substantially identical. A bidirectional overvoltage protection device 250 for protecting circuits from overvoltages of either polarity is thus provided.

Subsequent to the formation of the buried regions 254, 256, 260 and 262, the wafer is prepared to form a pair of first base regions 268 and 272 in respective sides of the wafer. The wafer is not masked when forming the base regions. The first base region 268 is lightly doped to form an 8–15 ohm N-type layer, and is formed so as to be contiguous with the n-well 264. The first base region 268 is formed by depositing an N-type impurity (such as phosphorus) into the surface and diffusing the impurity atoms to a depth substantially as shown in FIGS. 17 and 18. Because of the inherent characteristics of the high temperature diffusion process, an impurity gradient is formed in the first base region 268. The gradient of the N-type impurities in the first base region 268, together with the heavily doped P-type buried regions, define a frustoconical-shaped junction 270 around a portion of each buried region. A similar first base region 272 is formed in the opposite side of the wafer contiguous with the respective n-well 266. The lightly-doped first base region 272 also forms a frustoconical-shaped junction 274 with respect to the buried regions 257 associated with the counterpart overvoltage protection device.

In the next step of the process in fabricating the device 250, a second, or upper, base region 276 is formed over the first base region 268. A second base region 278 is also formed on the opposite side of the wafer, over the other corresponding first base region 272. In particular, the second base regions 276 and 278 are formed with a high concentration of N-type impurities. The second base regions 276 and 278 have sufficiently high concentrations such that the upper sections of the respective buried regions 256 and 257 become inverted, thereby resulting in a layer of N-type impurities in the second base regions 276 and 278. While only two buried regions are illustrated for each overvoltage protection device in FIGS. 17 and 18, all four buried regions of each device undergo the same processing. As a result of such processing, a breakdown junction 280 is formed at the interface between the top lateral surface of the buried region 256 and the second heavily doped base region 276. A similar breakdown junction 282 is formed with respect to the buried region 257 and the second base region 278 formed in the opposite side of the device 250. These junctions of the buried regions define the breakover voltage of the overvoltage protection devices. Importantly, these breakdown junctions are formed laterally offset from respective portions of the emitter region. It is generally inconsequential if other portions of the buried regions forming respective high breakdown voltage junctions with the lightly doped base regions are formed under the emitter regions. The heavily doped second base regions 276 and 278 effectively "bury" the respective buried regions 256 and 274, as well as the other buried regions (not shown) formed in the top and bottom surfaces of the wafer.

Respective emitter regions 258 and 286 for each overvoltage protection device are next formed in the opposing sides of the device 250. A p-type impurity, such as boron, is used to form the emitter regions 258 and 286. As shown in FIG. 17, the top emitter region 258 is formed laterally with respect to the buried region 256. In like manner, the bottom emitter region 286 is formed laterally with respect to the corresponding buried region 257. Each buried region is similarly offset with respect to the associated emitter regions. The offset nature of the breakdown junctions of the buried regions, and the respective emitter regions provide the same advantages as noted above in connection with the other embodiments of the invention. Importantly, as illustrated in FIG. 16, the emitter region 258 is formed around at least a portion of each circular-shaped buried region. With this arrangement, no portion of the emitter region 258 overlies any of the corresponding breakdown junctions of buried regions 254, 256, 260 or 262. As noted above, the buried regions and the emitter region of the counterpart overvoltage protection device are similarly constructed.

In accordance with an important feature of the invention, the top and bottom surfaces of the wafer are masked to form open areas vertically aligned with each of the buried regions. The wafer is subjected to an oxidizing environment in which a silicon oxide is grown on the exposed silicon surface in the openings of the mask After the mask material is removed, the silicon oxide islands are located with respect to the buried regions in the manner as shown in FIGS. 17 and 18. Silicon oxide island 284 overlies buried region 256 and silicon oxide island 285 underlies buried region 282. The silicon oxide islands 284 and 285 extend from the edge of the die to a location partially overlapping the respective emitter regions 258 and 286. As noted above in the other embodiments of the invention, the silicon oxide islands are not conductive, and thus force the current in the device prior to initial turnon to flow from the buried region to the respective emitter region. In FIG. 17, the current flow through the buried region 256 flows out of the breakdown junction 280 in the second base 276 and to the emitter region 258. If metal were to overlie the buried regions instead of the insulating material, then the base-emitter junction would either not turn on at all, or would require an impractically high current for turn on of the device. While silicon oxide is disclosed for use as an electrical insulator, a glass passivation, silicon nitride or other suitable electrical insulating material can be used.

In the subsequent processing stages of the device 250, a trench 290 is formed through the second base region 276 for electrically isolating the buried region 262 from the adjacent portion of the second base region 276. The shape of the trench 290 is a partial circular shape, concentric with the frustoconical-shaped buried region, such as shown in FIG. 16. A similar trench 292 is formed through the second base region 276 for providing electrical isolation from the respective buried region 260. The trenches 290 and 292 are then filled with a standard leadaluminoborosilicate glass insulating material. The function of the glass-filled trenches 290 and 292 is for forcing the conduction of carriers from the buried regions 260 and 262 to the emitter 258, rather than to a metal contact (not shown) via the second base region 276. With this construction, the carriers generated by the buried region 260 favor a conduction path in the heavily-doped portion of the second base region 276 located adjacent to the emitter 258, rather than through the lightly-doped first base region 268 under the glass-filled trenches 290 and 292 to the second base region 276. Stated another way, were it not for the glass-filled trenches 290 and 292 located as shown, the carriers emitted from the buried regions 260 and 262 would be short circuited directly through the second base region 276 to the corresponding contact (not shown), rather than be carried to the emitter 258. The glass-filled trench 293 formed on the opposite side of the device 250 function to provide the same advantage for the other overvoltage protection device.

The devices 250 formed on the semiconductor wafer are separated from each other by a grid network formed in the opposing sides of the semiconductor material. The outline of the grid network is shown by line 288 of FIG. 16. The grid network is filled with the glass insulating material 294 shown in FIG. 17. The glass insulating material 294 provides a protective passivation layer to the side edges of the chip.

Figure 19:
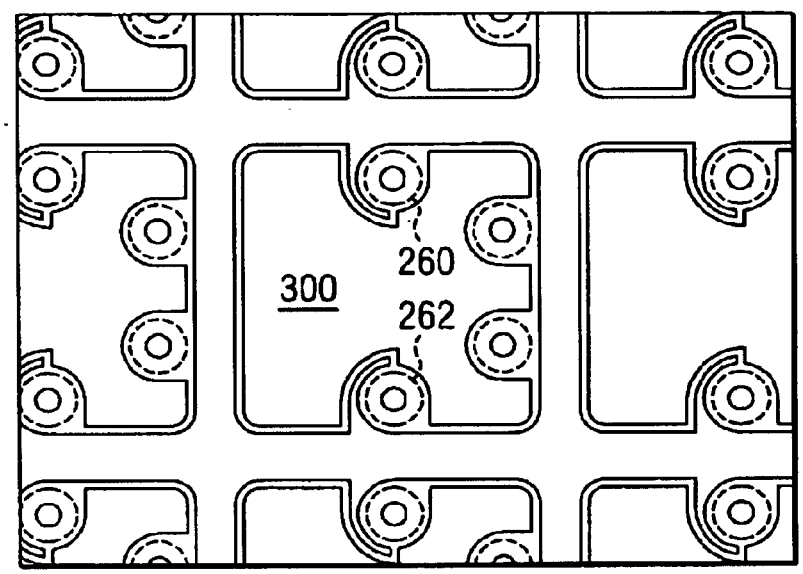
FIG. 19 is a top view of the device of FIG. 16 subsequent to a metalization of the chip.

Before being scribed and broken into the individual devices 250, the wafer is masked to define metal contact areas. Once masked, a metal is deposited so as to form the contacts on each side of the chip. The shape of the contacts on one side of the chip is shown in FIG. 19. Illustrated is a top contact 300 coated with a solder material. A corresponding bottom contact 302 is formed in a mirror image of that shown in FIG. 19. The contacts 300 and 302 do not overlie the buried regions. The peripheral grid network is shown providing electrical isolation between the center buried regions 260 and 262 and the second base region (not shown).

A device formed according to the foregoing provides an overvoltage protection device characterized by a breakover voltage ($V_{BO}$) of about 10 volts and a device capacitance of about 60 pf.

Figure 20:
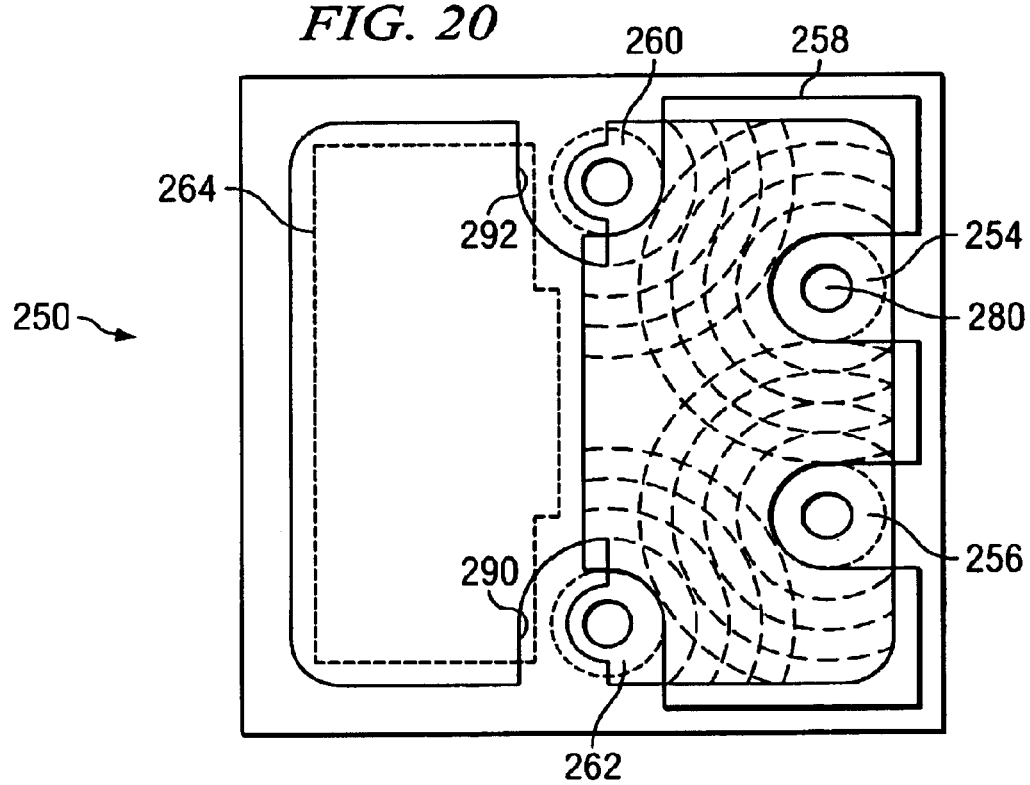
FIG. 20 is a top layout view of the device of FIGS. 16–19, showing the pattern of carriers emanating from each buried region.

FIG. 20 shows in diagrammatic form the spreading of the activated area during initial turn on of one overvoltage protection device, it being realized that the same type of action occurs with the counterpart overvoltage protection device. The circular-shaped buried regions influence corresponding circular areas where carriers travel outwardly under the surface of the emitter region 258. As can be seen, a major portion of the surface of the emitter region 258 receives the carriers and is thus involved during the turn on of the overvoltage protection device. With a larger surface area of the emitter region 258 active during turn on, a higher surge current can be handled, and thus less voltage overshoot reaches the circuits to be protected. A more detailed discussion of the advantages of the plural buried regions spaced around the emitter region is set forth below in conjunction with FIG. 24.

FIGS. 21–24 illustrate yet another embodiment of the invention. Here, the device 310 is formed on a square semiconductor chip having an area of 105 mils square. The larger area device has a higher current carrying capability. With this increased semiconductor area (as compared to the FIGS. 16–20 embodiment), an additional buried region is employed. Three buried regions 312, 314 and 316 are formed near the edge of the device 310, while two other buried regions 318 and 320 are formed near the center of the chip. Corresponding buried regions (not shown) are formed in mirror image locations on the bottom side of the chip. The buried regions are located at the apexes of respective imaginary triangles. In other words, buried regions 312, 314 and 318 are formed at the apexes of a first triangle; buried regions 318, 314 and 320 are formed at the apexes of a second triangle; and buried regions 314, 316 and 320 are located at the apexes of a third triangle. The breakdown junctions of the buried regions 312 and 316 are laterally offset from respective corners of the emitter region 332. As will be described below, this positioning of the buried regions with respect to the emitter region 332 facilitates a high-speed turn-on characteristic of the device 310.

Figure 21:
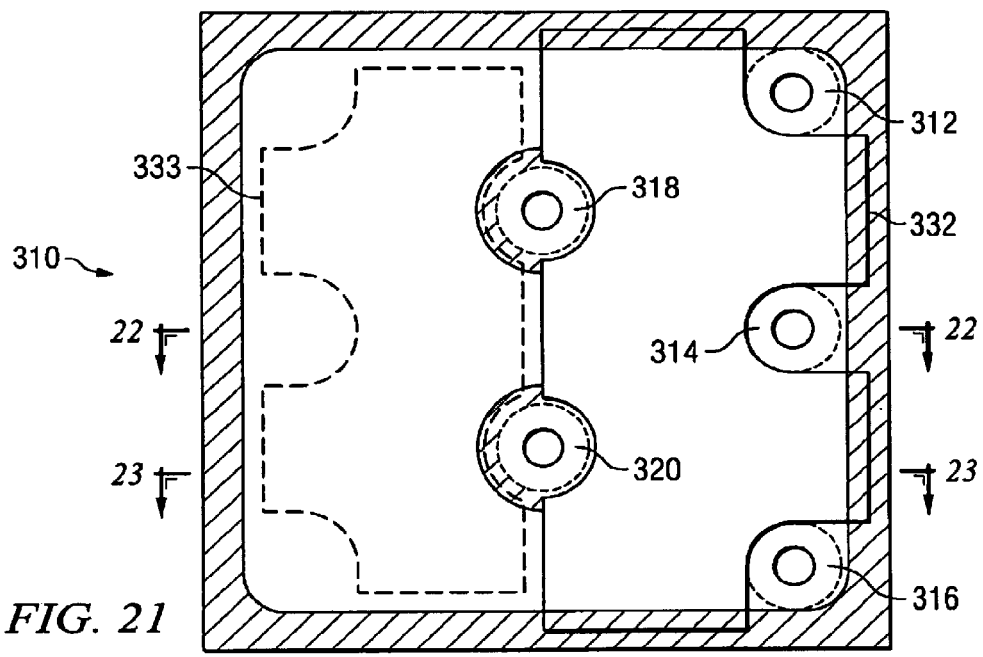
FIG. 21 is a top layout view of another embodiment similar to that of FIG. 16, but employing a larger emitter and thus more buried regions for providing carriers thereto.

The various semiconductor regions of the device 310 are otherwise formed in a manner substantially the same as that described above in connection with FIGS. 16–20. The mid-region of the device 310 is identified as reference numeral 322 in the cross-sectional view of FIGS. 22 and 23. The buried regions of the device 310 are identified in FIG. 22 as reference numerals 314 for a top buried region and 324 for a bottom buried region. The device 310 of FIG. 23, when viewed along a cross-sectional view of line 23—23 of FIG. 21, illustrates a top buried region 320 and a bottom buried region 326. The first base region formed of a lightly doped N-type material is identified as reference numeral 328. The first base region formed in the bottom surface of the chip and associated with the counterpart overvoltage protection device is identified as reference numeral 330. The n-wells are identified as reference numerals 333 and 334. The more heavily doped second base regions are identified as reference numerals 327 and 329. The top P-type emitter region is identified by reference numeral 332, and the bottom P-type emitter region is identified by reference numeral 335. The electrically isolating glass-filled trenches are shown as reference characters 336 and 338.

Figure 22:
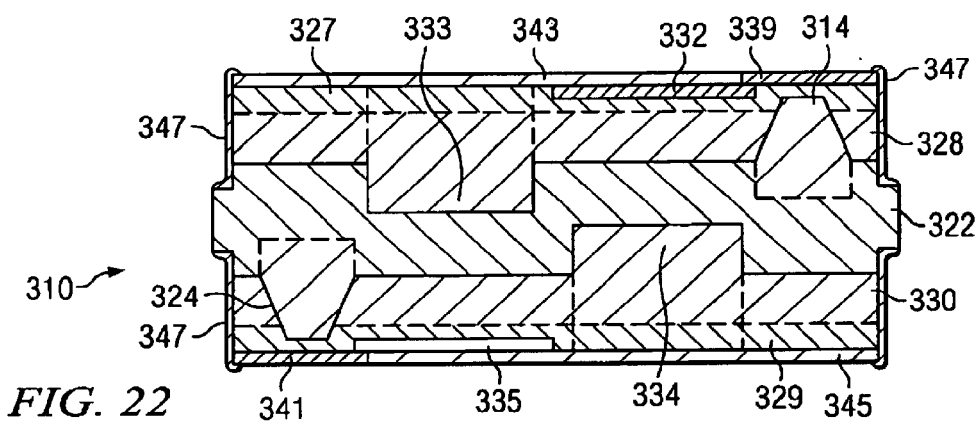
FIG. 22 is a cross-sectional view of the device of FIG. 21, taken along line 22—22 thereof.
Figure 23:
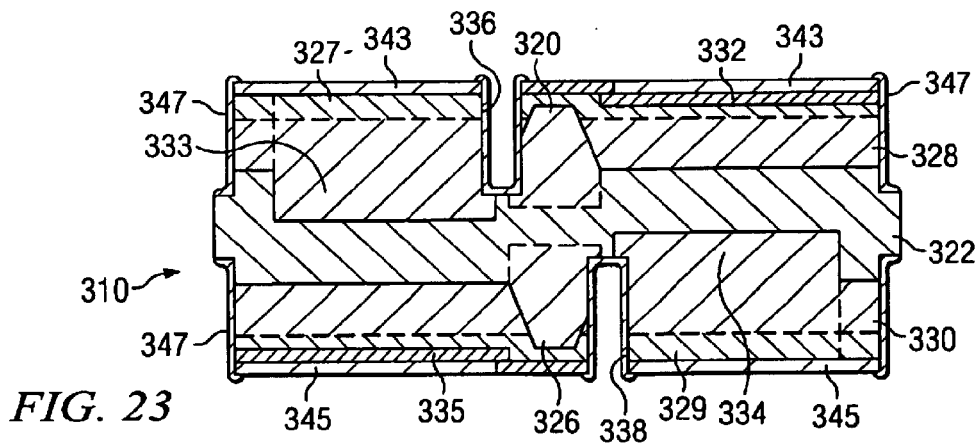
FIG. 23 is a cross-sectional view of the device of FIG. 21, taken along line 23—23 thereof.

As with the other embodiments of the invention described above, the surface areas of the semiconductor chip axially aligned with the buried regions are covered with a silicon oxide ($SiO_2$) or other insulating material to prevent a low resistance path for the carriers from the buried regions to the metal contacts of the chip. For example, the silicon oxide island 339 overlies the top buried region 314 of the device 310, and extends a short distance over the top surface of the top emitter region 332, as shown in FIG. 22. Similarly, the silicon oxide island 341 underlies the bottom buried region 324 and partially covers an edge of the bottom emitter region 335. The other buried regions of the device 310 are associated with similar silicon oxide islands. The device 310 includes a top metal contact 343 and a bottom metal contact 345. The top metal contact 343 is formed over the top surface of the second base 327 and overlies the remainder of the surface area of the top emitter region 332, thereby short circuiting the semiconductor regions together. In order for carriers to travel from the buried region 314 to the top metal contact 343, such carriers must first pass under the emitter region 332, thereby forward biasing the emitter junction between the emitter region 332 and the second base region 327. The bottom metal contact 345 is similarly constructed to provide a similar electrical operation with respect to the bottom buried regions and the bottom emitter region 335. A glass passivation 347 functions to protect the device 310 from the environment.

While the embodiments of the invention shown in FIGS. 16–24 are illustrated with plural buried regions spaced around the peripheral edge of the respective emitter regions, additional buried regions could also be formed under central circular openings formed through the emitters. Also, while it has been found that circular-shaped buried regions of a specified diameter exhibit less device capacitance, as compared to cross-sectionally square-shaped buried regions of comparable widths, other shapes of the buried regions can be used. Indeed, the device can be fabricated using some buried regions of one cross-sectional shape, and other buried regions located at other areas (such as corners) can be fabricated with different cross-sectional shapes. While the utilization of square or rectangular-shaped buried regions may provide a better coverage of the emitter area with carriers, with fewer areas void of carriers during initial turn on, the use of such shape is believed to represent only a nominal increase in the turn-on speed of the device, with a corresponding disadvantage of higher device capacitance. As will be set forth more fully below, the pattern by which carriers are emitted from the buried regions is generally similar to the cross-sectional shape of the buried regions employed.

Figure 24:
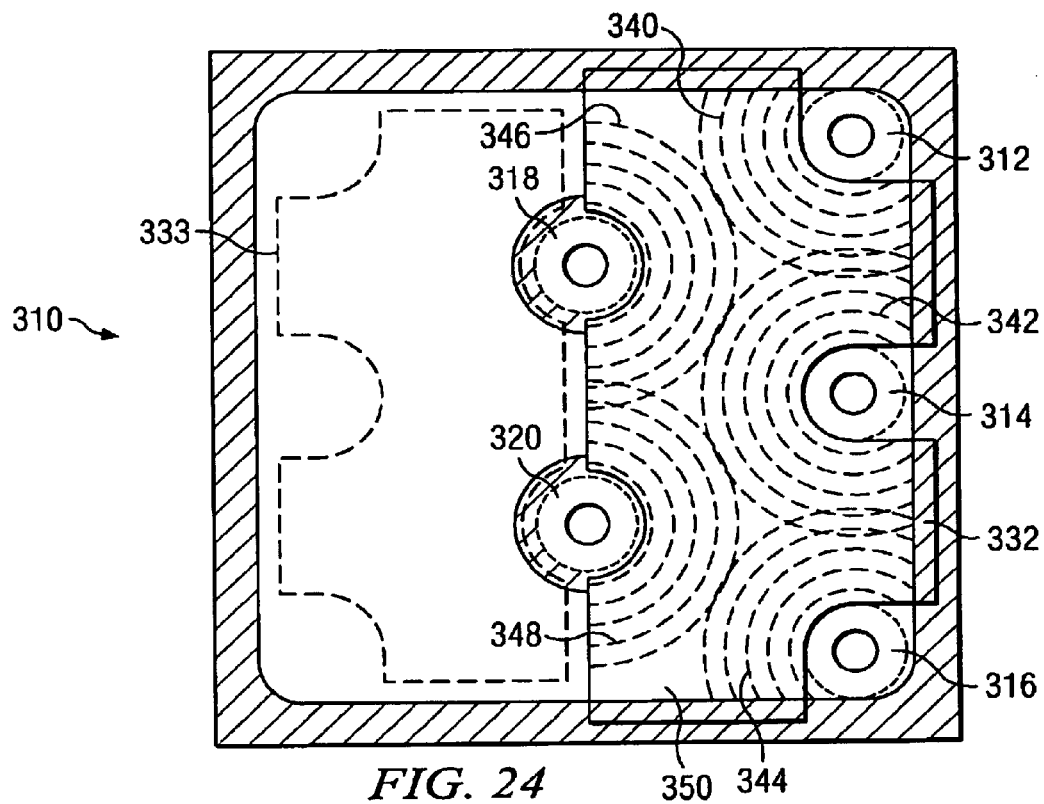
FIG. 24 is a top layout view of the device of FIG. 21, showing the pattern of carriers emanating from each buried region.

As noted above, the function of the buried regions is to facilitate the initial turn on of a low breakover voltage device, while yet maintaining a low capacitance. In order to accomplish this, and to reduce or eliminate "bottle-necking"

of the current during turn on, it is desirable to form the buried regions in a spaced-apart manner so that the carriers emitted therefrom are distributed over a wide area, thereby allowing a large area of the emitter region to become quickly functional and effect a high current turn on of the device. As is well known, turn on of the overvoltage protection device is initiated by the current carriers flowing from the highly conductive buried regions through the base region under the emitter region, whereupon the base-emitter junction becomes forward biased and thereafter device conduction occurs in the semiconductor regions outside of the buried regions. A high current turn on is achieved by forming the buried regions in a specified shape, and by positioning the buried regions around the emitter region. In other words, and as shown in FIG. 24, the buried regions 312–320 are formed in a cross-sectionally circular shape to provide corresponding circular patterns or areas in which the carriers migrate and thereby spread the activated area during turn on. The buried region 312 is formed adjacent and laterally offset from a corner portion of the emitter region 332. In like manner, the buried region 316 is formed adjacent another corner of the emitter region 332, and laterally offset therefrom. The buried region 314 is formed in a location intermediate the corner buried regions 312 and 316. The pattern by which carriers are emitted from the buried region 312 are shown by broken lines 340. As can be seen, the upper right corner portion of the emitter region 332 is provided with carriers for initiating turn off of the device. The middle buried region 314 produces a pattern in a semi-circular area identified by broken lines 342. Much like the pattern 340 generated by the corner-located buried region 312, the buried region 316 generates a quarter-circle pattern 344. The carrier patterns 340 and 342, and the carrier patterns 342 and 344, each overlap somewhat. The remaining two buried regions 318 and 320 generate corresponding semi-circular patterns 346 and 348 which also overlap somewhat. The peripheral areas of carrier patterns 346 and 348 are generally contiguous with the other carrier patterns 340, 342 and 344. As can be appreciated, the concentration of carriers decreases as a function of distance from the buried regions. While there may exist a few areas under the emitter region 332, such as area 350, that receive fewer carriers than the other emitter areas, substantially the entire area of the emitter region 332 is provided with carriers generated from the various buried regions. Full turn on of the device 310 can thus be initiated in a high speed manner. This substantially reduces bottle-necking of the current and allows high transient currents to be accommodated by the device 310.

Figure 25:
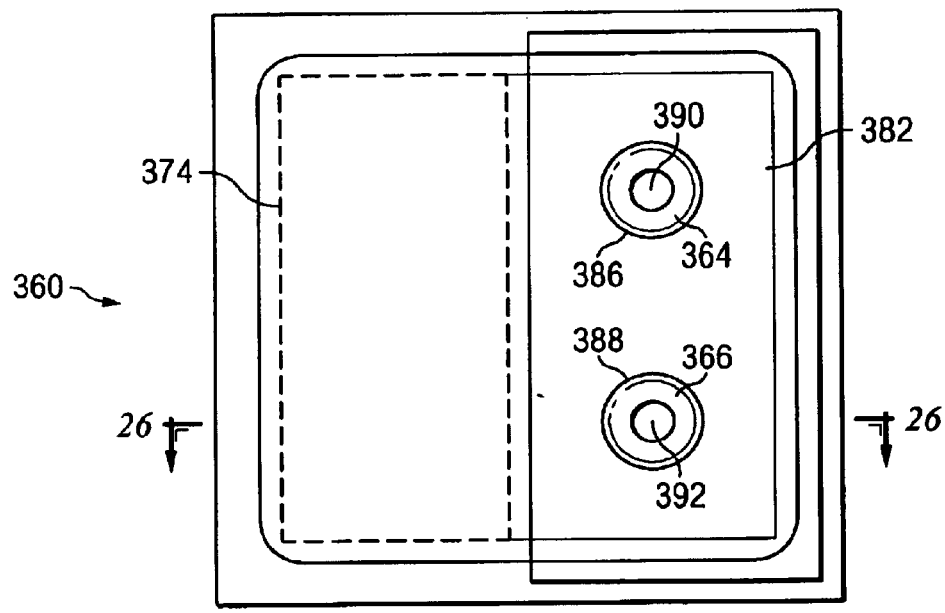
FIG. 25 is a top view of another embodiment of the invention where the buried regions are located under corresponding openings in the emitter region.
Figure 26:
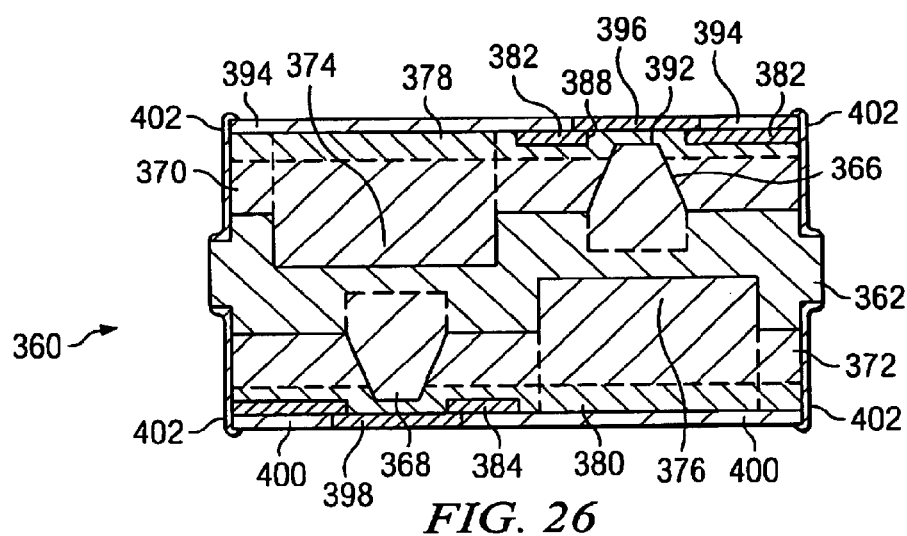
FIG. 26 is a sectional view of the device of FIG. 25, taken along line 26—26 thereof.

FIGS. 25 and 26 depict yet another embodiment of the overvoltage protection device 360 constructed according to the principles and concepts of the invention. This device is preferably constructed on a chip having an area of 75 mils square. The device is formed with a P-type mid-region 362. Formed in both surfaces of the chip are a pair of P-type buried regions. The overvoltage protection device formed in the top surface of the chip is formed with two buried regions 364 and 366. The overvoltage protection device formed in the bottom surface of the chip also has two buried regions, one shown as reference numeral 368. Diffused in both the top and bottom surfaces of the chip are respective lightly-doped N-type first base regions 370 and 372, and corresponding n-wells 374 and 376. The heavily doped N-type second base regions 378 and 380 are formed in the respective lightly doped first base regions 370 and 372. A top surface emitter region 382 is formed in the second base region 378, and a bottom surface emitter 384 is formed in the corresponding second base region 380. The various processing steps described above in connection with the embodiments of FIGS. 16–24 can be used in forming the device of FIGS. 25–27.

In this embodiment, the buried regions are centrally located under the emitter region 382, and not peripherally around the edge of the emitter region 382 as in other embodiments described above. Accordingly, the top metal contact 394 is formed around the silicon oxide island 396 which overlies the top buried region 392, shown in FIG. 26. The silicon oxide island 396 is somewhat larger in diameter than the opening in the emitter region 382, and thus overlies at least an annular portion of the emitter region 382. The bottom silicon oxide islands, one shown as number 398, and the bottom metal contact 400 are similarly constructed on the bottom surface of the device 360. A glass passivation 402 protects the device 360 from adverse effects of the environment.

In accordance with an important feature of the invention, the emitter region 382 has formed therein a pair of circular-shaped openings 386 and 388. Formed adjacent to and laterally offset from the annular edges of the openings 386 and 388 are the respective breakdown junctions 390 and 392. Each buried region 364 and 366 is formed so as to be centered about an axis extending through the respective emitter region openings 386 and 388. Moreover, the buried regions 364 and 366 are formed with circular-shaped breakdown junctions 390 and 392. The buried regions are formed in the other surface of the chip in a similar manner with respect to openings in the emitter region 384. As noted above, the circular-shaped breakdown junctions of the buried regions permits the device to be constructed with a small capacitance.

Figure 27:
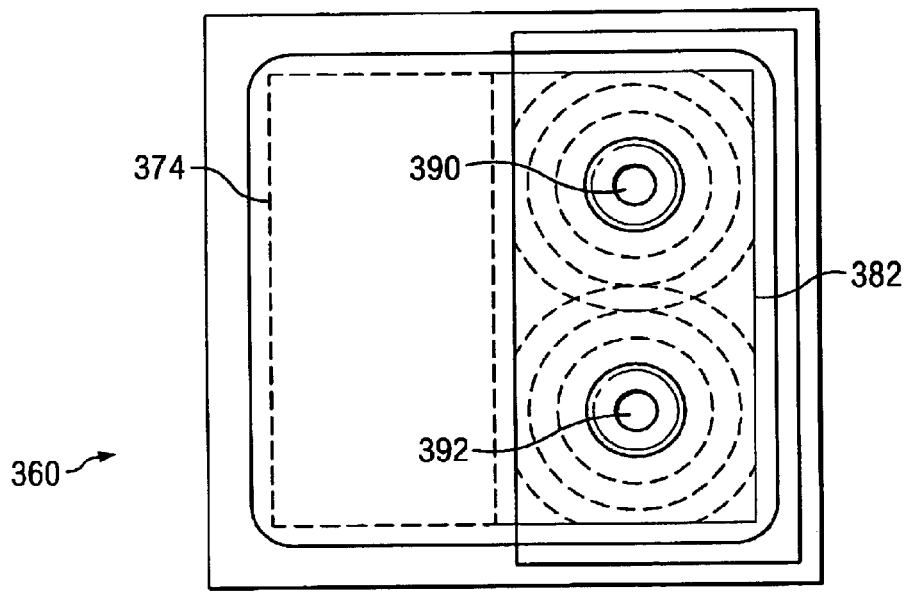
FIG. 27 is a top view similar to that of FIG. 25, but with broken lines showing the emanation of carriers from the buried regions.

As can be seen from FIG. 25, each buried region 364 and 366 is formed generally centered in a half section of the emitter region 382. The carriers emitted from the breakdown junctions 390 and 392 thus allow a large surface area of the emitter region to become forward biased during initial turn on of the device 360. The emanation of the carriers from the breakdown junctions 390 and 392 is illustrated in FIG. 27. It can be seen that with this construction of the overvoltage protection device 360, the overall capacitance is small due to the use of only two buried regions per overvoltage protection device, and a high-speed turn on is achieved. While FIGS. 25–27 illustrate an embodiment where the emitter region is formed with plural openings therein, those skilled in the art may find that the principles of the invention can be employed in constructing a similar device having an emitter with a centrally-located emitter opening. A buried region would be located under the central opening to provide carriers to a wide area of the emitter.

As noted above, a low capacitance overvoltage protection device can be used for protecting lines carrying high speed signals. Because the buried regions necessarily involve the use of heavily doped regions to achieve a low breakdown voltage, such a structure also involves a larger capacitance. This is because with high concentration P-type and N-type junctions, the depletion region therebetween is small, thus presenting a high capacitance structure. The high concentration buried regions together with the high concentration second base regions form respective breakdown junctions characterized with a relatively high capacitance. In order to minimize the overall capacitance of the device, a small-area junction is formed in connection with each buried region, and plural buried regions are used. This structure not only reduces capacitance, but also provides a mechanism for distributing carriers to a large surface area of the emitter region during turn on.

FIGS. 28–32 illustrate another embodiment of the overvoltage protection devices 410 constructed according to the invention. The chip 410 includes a first overvoltage protection device responsive to positive polarity overvoltages, and a second overvoltage protection device responsive to negative polarity overvoltages. In the top view of the overvoltage protection chip 410 shown in FIG. 28, there are illustrated two top buried regions 412 and 414 underlying silicon oxide insulation islands 416 and 418. These insulating islands 416 and 418 are associated with the first overvoltage protection device formed in the right hand portion of the chip 410. The respective breakdown junctions 441 and 442 of the top buried regions 412 and 414 are centered within respective openings 416 and 418 in a top emitter region 420. A number of shorting dots, one shown as reference character 422, are formed through the top emitter region 420. As will be described in more detail below, the location of the shorting dots 422 formed in the top emitter region 420 provide optimum performance of the overvoltage protection chip 410, in terms of holding current and switching current. A heavily doped tub 424 is shown associated with the second overvoltage protection device formed in the left portion of the chip 410. In all respects, the first and second overvoltage protection devices are formed at the same time and with the same shape masks to achieve the same electrical characteristics for symmetrical operation with positive and negative polarity voltages.

Figure 29A:
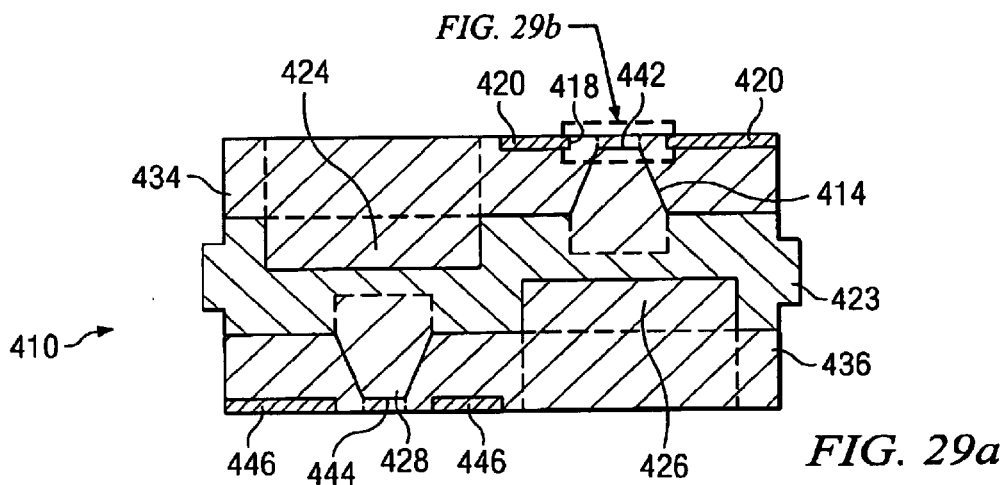
FIG. 29a is a sectional view of the overvoltage protection device taken along line 29a—29a of FIG. 28.

The processing steps for fabricating the overvoltage protection device 410 are best understood by referring first to FIG. 29a which illustrates the chip 410 substantially completed. The starting wafer of semiconductor material is preferably P-type silicon material with a 50 ohm*cm resistivity. In the preferred embodiment, the wafer is about 10 mils thick. Each chip on the wafer is masked and processed so as to be about 85 mils square. The semiconductor material of the wafer forms a mid-region 423 for both the first and second overvoltage protection devices.

Each side of the wafer is masked with a suitable mask material to deposit a heavily doped N+ tub 424 for the second device and an N+ tub 426 for the first device. Because the tubs 424 and 426 are located deep in the wafer, the time for driving the N-type impurities into the wafer may be on the order of a couple of days. As noted above in connection with the other embodiments, the N-type tubs 424 and 426 effectively thin the mid-region to increase the speed of operation of the first and second devices.

Figure 28:
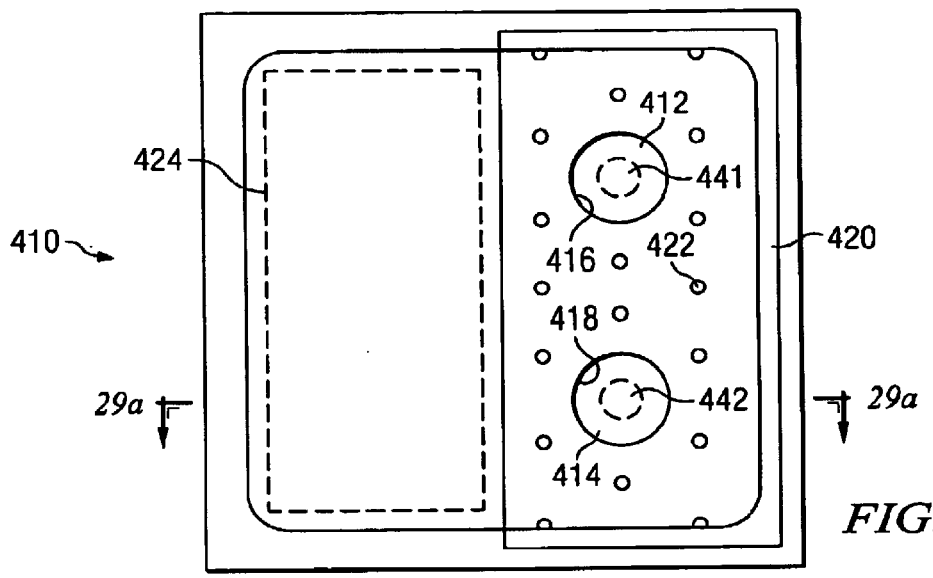
FIG. 28 is a top view of another embodiment of the invention where the emitter has shorting dots, and with a different construction of the heavily doped second base region.
Figure 30:
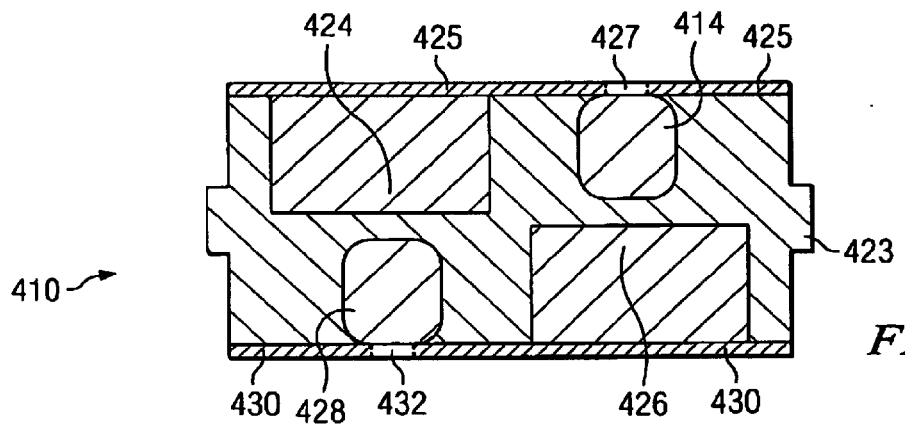
FIG. 30 is a cross-sectional view of the overvoltage protection device, illustrating the mask used to form the heavily doped second base region.

The wafer is masked to form two spaced-apart buried regions for the first device and a pair of spaced-apart buried regions for the second device. FIG. 28 illustrates the location of the two buried regions 412 and 414 that form the first overvoltage protection device, it being understood that the bottom two buried regions are located on the bottom of the chip in a mirror image location. The cross-sectional view of FIG. 30 illustrates the top buried region 414 of the first device and the bottom buried region 428 of the second device, immediately subsequent to the formation of the buried regions. Importantly, the pairs of buried regions are located generally centrally in respective right and left halves of the chip 410. This arrangement of buried regions allows the emitter-base junctions to be turned on over a large surface area thereof, thus avoiding small area paths for surge currents during initial turn on of the devices. The top buried regions 412 and 414 are formed using a top mask 425 with two 4.0 mil diameter openings, one shown as reference numeral 427 in FIG. 30. The bottom two buried regions are formed using a bottom mask 430 with respective 4.0 mil diameter openings. The bottom buried region 428 is formed through the bottom mask opening 432.

In forming the buried regions, a high surface concentration P-type impurity, such as boron, is deposited on the surface of the wafer. The wafer then undergoes a deep drive at a temperature of about 1275° C. for about twenty four hours, which results in surface concentration of about $1.2\times 10^{19}$ atoms/cm$^3$. When diffused and driven into the p-type mid-region 423 through the respective 4.0 mil diameter mask openings, the buried regions 412 and 414 each have a resulting diameter of about 11 mils. The frustoconical shape of the buried regions 412 and 414 are a result of the formation of a lightly-doped base region to be described below. The bottom pair of buried regions are formed in a manner substantially identical to the top buried regions 412 and 414. The small-diameter top and bottom buried regions that result after the diffusing and deep drive steps provide heavily doped semiconductor regions that facilitate a high speed turn on of the respective devices with correspondingly small capacitances. Devices with low breakover voltages and low off-state capacitances are ideally suited for protecting high speed digital and analog communication lines from overvoltages of either polarity. In practice, the overvoltage protection device formed according to this embodiment has a breakover voltage of about 8–10 volts, and an off-state capacitance of about 40–45 pf.

Returning to FIG. 29a, the wafer is next subjected to a surface diffusion of an N-type dopant, such as phosphorus, to produce a lightly doped first base 434 in the top of the wafer. A similar lightly doped first base 436 is formed at the same time in the bottom of the wafer. The lightly doped first base regions 434 and 436 have a higher resistivity of about 8–15 ohm/square. This low dopant concentration provides junction capacitances that are low and allow high speed operation of the chip 410. The N-type impurity of the lightly doped regions 434 and 436 offset the p-type impurities of the buried regions 414 and 428 to produce the frustoconical shape.

Figure 29B:
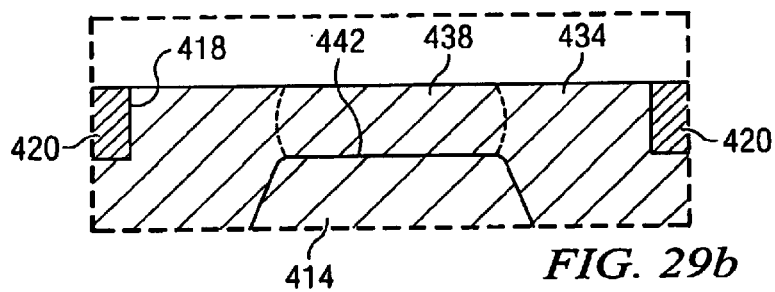

In order to recess the top of the top buried region 414 and the bottom of the bottom buried region 428 in FIG. 29a from the respective top and bottom surfaces of the wafer, a high concentration of an n-type impurity, such as phosphorus, is deposited on both sides of the wafer through a mask substantially identical to the buried region mask shown in FIG. 30. The N-type impurities are driven into the opposite sides of the wafer at a temperature of about 1275° C., for a period of time of about three hours. This results in heavily doped base regions having respective surface concentrations of about $3.0\times10^{19}$ atoms/cm$^3$. The N-type impurity forms a second heavily doped base region 438 above both top buried regions 412 and 414, as well as a second heavily doped base region 440 underlying both bottom buried regions. The high concentration of N-type impurities of the second heavily doped base regions offset the high concentration of the P-type impurities of the buried regions, thereby producing breakdown junctions below the respective top and bottom surfaces of the wafer. This is shown in the enlargement of FIG. 29b. In practice, the breakdown junction 442 is located about 0.28 mils below the surface of the wafer, and the bottom of the emitter region 420 is located about 0.35 mils below the surface of the wafer. The breakdown junction 442 is shown in connection with the top buried region 414, and the breakdown junction 444 is shown in connection with the bottom buried region 428. It is the top portion of the buried region 414 that forms the breakdown junction where carriers emitted therefrom travel to the emitter region during initial turn on of the device. As noted above in conjunction with the other embodiments of the invention, the top portion of the buried region 414 is characterized with the heaviest concentration of impurities, and thus has a lower junction breakdown voltage, as compared to the other junction areas of that buried region 414. The same principle applies to the other buried regions of the chip 410.

In the next processing step in fabricating the overvoltage protection chip 410 according to this embodiment, the wafer is masked to define the emitter regions for both devices. Again, the shape and size of the top emitter region 420 is a mirror image of the bottom emitter region 446. Accordingly, only the steps in forming the top emitter region 420 will be described. A suitable mask is employed to form the emitter region 420. The emitter region mask is formed with a pair of openings, each with a diameter of about 12 mils. The openings in the emitter region mask are axially aligned with both of the top buried regions 412 and 414. In addition to the two openings for the buried regions, the emitter region mask has a number of smaller-diameter spaced-apart openings for defining shorting dots in the emitter region. The shorting dots, one shown as reference character 422, can be used for increasing the holding current required for maintaining the device in an on state. The shorting dots function to cause current from the respective buried region to bypass the emitter region, thereby increasing the current required for turn on and turn off of the device. In the event that a lower turn on and turn off current is desired, fewer shorting dots, or no shorting dots at all, may be employed.

FIG. 28 illustrates the emitter region opening 416 aligned over the buried region 412, and the emitter region opening 418 aligned over the buried region 414. Illustrated also is the pattern of the shorting dots according to the disclosed embodiment. Each shorting dot opening in the emitter mask has a diameter so as to form an emitter region shorting dot with a diameter of about 2 mils. Three columns of shorting dot openings are formed in the mask, with the openings in adjacent columns vertically offset so as to define a triangular array of openings. Importantly, the triangular pattern of openings form a circular pattern of six shorting dots around each emitter opening located above the respective buried regions 412 and 414. Preferably, there is a spacing of about 6.4 mils between the edge of each emitter opening, and the six closest shorting dots. This arrangement of shorting dots provides a wide distribution of carriers from the buried regions 412 and 414 under the emitter region to promote a large area of junction turn on between the emitter region 420 and the lightly doped first base region 434. The shorting dots further removed from the buried regions affect the turn off current of the device. The function of the remote shorting dots is to increase the turn off current of the device.

In forming the emitter region 420 in the lightly doped N-type first base region 434, a P-type impurity, such as boron, can be used. The impurity level is preferably heavy to form a P+ emitter 420 with a surface concentration of about $4\times10^{19}$ atoms/cm$^3$. As illustrated in FIG. 29a, the opening 448 in the emitter region 420 is spaced apart from the breakdown junction 442 of the buried region 414. Moreover, the breakdown junction 442 maybe located from the surface of the chip a distance less than the bottom pn junction formed between the emitter region 420 and the lightly doped first base region 434. Substantially all of the carriers generated during initial turn on of the device thus travel laterally and generally parallel to the top surface of the chip 410, from the breakdown junction 442 to the undersurface of the emitter region 420. Because the resistivity of the lightly doped first base region 434 is relatively high, a low turn on current would result were it not for the shunting effect of the shorting dots immediately surrounding the emitter opening 448.

Figure 31:
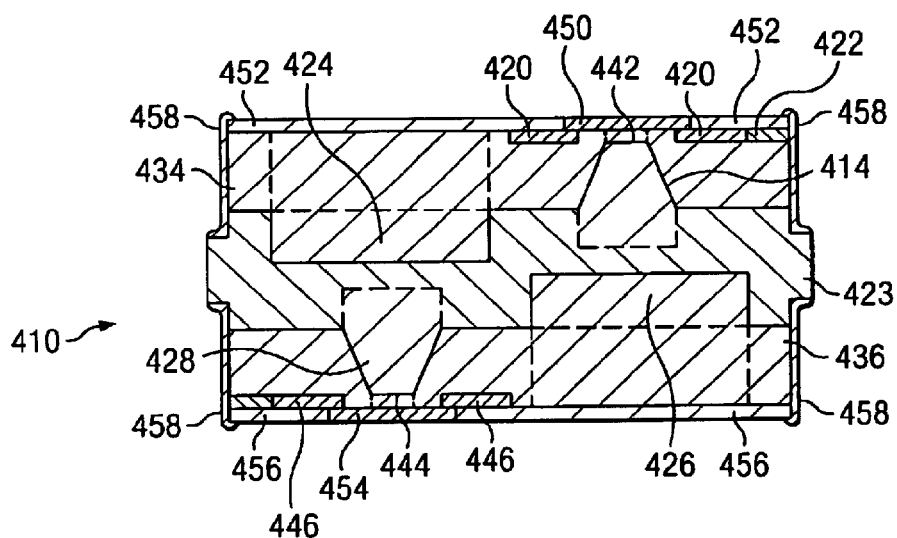
FIG. 31 is a cross-sectional view of the overvoltage protection device, illustrating the metal contacts for the chip, and the insulation above and below the respective top and bottom buried regions.

The wafer is further processed to form silicon oxide islands over the buried region areas, and metal contacts on opposing surfaces of the wafer. This is illustrated in FIG. 31. As shown with respect to the top buried region 414, the overlying surface of the chip 410 is covered with a silicon oxide island 450. The silicon oxide insulating island 450 partially overlaps onto the circular opening in the emitter region 420 overlying the buried region 414. A conductive metal contact 452 is then deposited on the top surface of the wafer to provide an electrical contact to both overvoltage protection devices. The bottom of the wafer is processed in a similar manner to form the bottom pair of silicon oxide islands, one shown as reference character 454. A bottom metal layer 456 is formed on the chip 410 to provide the other metal contact for the overvoltage protection devices. Lastly, a trench is etched around each chip of the wafer, and the wafer is masked to define areas around each chip for passivation. A passivating glass material is formed on the surfaces of the trenches. This is shown as reference character 458 in FIG. 31.

Figure 32:
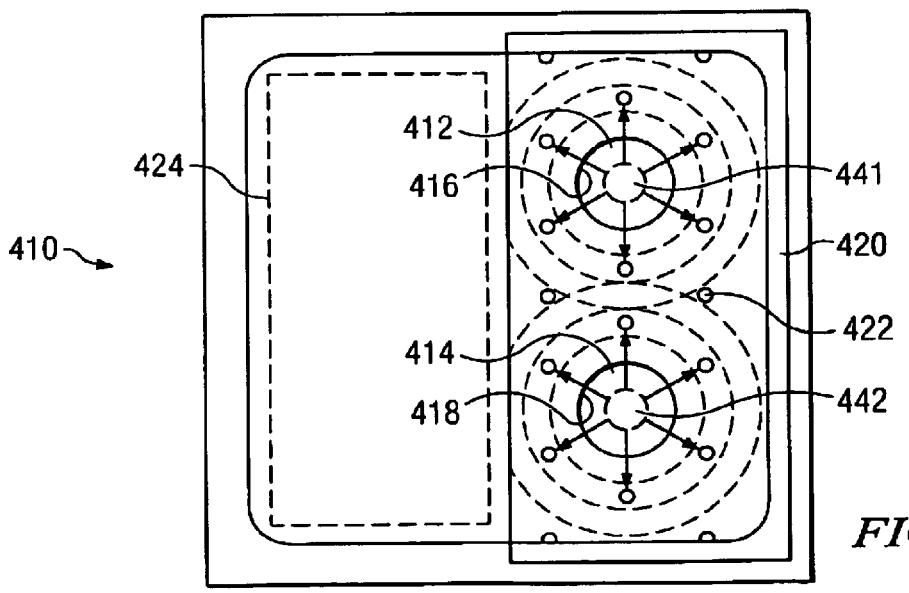
FIG. 32 is a top view of the overvoltage protection device of FIG. 28, illustrating the pattern of current flow that initiates emitter region activity after breakdown but prior to initial turn on of the device.

FIG. 32 is a top view of the chip 410 illustrating the pattern of carriers emitted from the breakdown junctions 441 and 442 (of the respective buried regions 412 and 414) and traveling under the bottom surface of the emitter region 420. For example, the radial arrows, one identified as numeral 460, show the path of current from the buried region breakdown junction 442, under a portion of the emitter region 420 adjacent the opening 418, to the nearest shorting dot 422. These carriers radiate outwardly in all directions from the breakdown junctions to the six nearest shorting dots. This is the current flow that initiates emitter activity after breakdown of the buried region junctions, but prior to turn on of the device. As can be seen, the carriers flow under a large surface area of the emitter region 420 and thus provide a large area for initial current flow to promote emitter activity. This prevents concentrated areas of large current flow and corresponding damage to the silicon crystals. The concentric circles shown in FIG. 32 illustrate the spreading of the activated area of the device during turn on.

While the foregoing describes the overvoltage protection chip 410 with two buried regions located centrally within an emitter region, those skilled in the art may prefer to utilize more than two buried regions. As noted above, the circular breakdown junctions of the buried regions facilitate a large area of current flow that activates emitter region activity. With a larger diameter breakdown junction, more carriers will be emitted. It is thus preferable to use more smaller diameter buried regions, than fewer large-diameter buried regions. The reason for this is that if, for example, the diameter of the breakdown junction is doubled, the circumference thereof doubles, but the area increases by a factor of four. Accordingly, the capacitance of the larger diameter breakdown junction increase disproportionately with respect to the circumferential length of the breakdown junction. In various applications, emitter opening shapes other than circular, such as oval, ellipse, polygon shapes with rounded corners, etc., may employed.

From the foregoing, numerous embodiments of the invention have been disclosed. In any of the embodiments, a breakover voltage of the device can be achieved sufficiently low for protecting TTL digital or other low voltage analog or digital lines, and the like. In addition, other equipment susceptible to extraneous high voltages can be protected with the described overvoltage protection devices. A common characteristic of each of the devices is that the buried region is laterally offset and adjacent to the emitter region so that the position of the breakdown junction of the buried region is independent of the distance between the emitter-base junction and the base-mid-region junction. Stated another way, with these designs, the breakover voltage is independent of the holding current of the device. By utilizing buried regions one over the other in bidirectional overvoltage protection devices, an economy of semiconductor area is realized. The utilization of metal contact area placement in conjunction with the lead frames allows self-registration between the elements during the reflow solder assembly process.

While the preferred and other embodiments of the invention have been disclosed with reference to specific semiconductor techniques and methods of operation, it is to be understood that changes in detail may be made as a matter of design choices, without departing from the spirit and scope of the invention, as defined by the appended claims. For example, the devices may be fabricated utilizing impurities of the opposite type, other than those disclosed above.

What is claimed is:

1. An overvoltage protection device, comprising:
   at least one base region formed in a semiconductor material;
   an emitter region formed in said base region such that a base-emitter junction is formed;
   at least one buried region forming a breakdown junction with said base region, said breakdown junction establishing a breakover voltage of said overvoltage protection device;
   said breakdown junction laterally offset from said emitter region so that said emitter region does not overlie the breakdown junction of said buried region; and
   an electrical insulator overlying the breakdown junction of said buried region, said electrical insulator functioning to prevent current flow from said breakdown junction through said insulator during initial breakover of said overvoltage protection device, wherein during initial turnon of said overvoltage protection device current flows generally laterally from the breakdown junction of said buried region toward said emitter region.

2. The overvoltage protection device of claim 1, wherein said emitter region includes a peripheral edge defining an external boundary around said emitter region, and wherein the breakdown junction of said buried region is laterally offset from the peripheral edge of said emitter region.

3. The overvoltage protection device of claim 1, wherein said emitter region has an opening therethrough, said opening in said emitter region defining an internal boundary edge with a circular profile, and wherein the breakdown junction of a buried region is located within said emitter region opening and laterally offset from said internal boundary edge.

4. The overvoltage protection device of claim 3, wherein said breakdown junction is circular in shape.

5. The overvoltage protection device of claim 1, wherein said emitter region includes one or more shorting dots formed therein, and each emitter region shorting dot has an overlying conductor to shunt current around said emitter region.

6. The overvoltage protection device of claim 1, wherein said buried region is characterized by a circular-shaped breakdown junction.

7. The overvoltage protection device of claim 1, wherein said overvoltage protection device defines a first overvoltage protection device, and further including a second overvoltage protection device formed in said semiconductor material substantially identical to said first overvoltage protection device, such that a bidirectional overvoltage protection device is provided.

8. The overvoltage protection device of claim 1, further including a metallic contact formed over a surface of the semiconductor material in contact with said emitter region, said metallic contact does not overlie the buried regions formed laterally offset from said emitter region.

9. The overvoltage protection device of claim 8, wherein said metallic contact is formed on one surface of said semiconductor material, and further including a metallic contact formed on an opposing surface of said semiconductor material, said metallic contacts being shaped as mirror images of each other.

10. The overvoltage protection device of claim 8, further including an electrically insulating material formed on the surface of the semiconductor material overlying said buried regions.

11. The overvoltage protection device of claim 1, wherein said buried regions are located adjacent an edge of said semiconductor material so as to be an edge fired overvoltage protection device.

12. The overvoltage protection device of claim 1, wherein said emitter region, base region and buried regions are configured to provide a breakover voltage suitable for protecting digital communication lines from overvoltages.

13. The overvoltage protection device of claim 1, wherein at least a portion each said buried region is formed with a frustoconical shape in said base region, where a top surface thereof defines said breakdown junction with said base region.

14. The overvoltage protection device of claim 13, wherein a base of each said frustoconical-shaped buried region is formed at an interface of said base region and a mid-region of said overvoltage protection device, and further including a cylindrical solid portion of each said buried region formed in said mid-region and extending to the base of said frustoconical-shaped buried region.

15. An overvoltage protection device, comprising:
    at least one base region formed in a semiconductor material;
    an emitter region formed in said base region such that a base-emitter junction is formed, said emitter region defined by a peripheral lateral boundary;
    at least one buried region for promoting current flow through said device during turn on, each said buried region formed with a breakdown junction for use in establishing a breakover voltage of said overvoltage protection device;
    at least a portion of said buried region being laterally offset from the peripheral boundary of said emitter region; and
    said portion of said buried region located with respect to the peripheral lateral boundary said emitter region so that carriers traveling between said buried regions and said emitter region during initial breakover of the overvoltage protection device travel generally in respective lateral paths.

16. The overvoltage protection device of claim 15, wherein said emitter region includes at least one opening therein, said opening bounded by a circular edge, and one said buried region is axially registered with said opening in said emitter region.

17. The overvoltage protection device of claim 15, wherein said buried region is formed using a mask having generally circular opening therein such that said buried region has a generally circular profile.

18. The overvoltage protection device of claim 15, wherein said base region comprises a first base region having an impurity concentration of a specified level, and further including a second base region having an impurity concentration greater than that of said first base region.

19. The overvoltage protection device of claim 18, wherein said first base region is formed having a well with a lateral shape that is generally the same as a lateral shape of said emitter region.

20. The overvoltage protection device of claim 15, wherein said overvoltage protection device defines a first overvoltage protection device, and further including a second overvoltage protection device formed in said semiconductor material substantially identical to said first overvoltage protection device, thereby providing a bidirectional overvoltage protection device.

21. An overvoltage protection device, comprising:
at least one base region formed in a semiconductor material;
an emitter region formed in said base region such that a base-emitter junction is formed, said emitter region having at least one opening therein bounded by a closed peripheral edge;
at least one buried region forming a breakdown junction with said base region, said breakdown junction for use in defining a breakover voltage of said overvoltage protection device, said breakdown junction being axially registered within said emitter region opening, and said breakdown junction being laterally offset from the closed peripheral edge of said opening; and
said breakdown junction of said buried region located with respect to the closed peripheral edge of said emitter region opening so that carriers traveling between said breakdown junction and said emitter region during initial breakover of the overvoltage protection device travel generally in a lateral path.

22. The overvoltage protection device of claim 21, further including plural said emitter region openings, and further including a plurality of said buried regions, each buried region having a breakdown junction axially aligned and laterally offset with a respective emitter region opening.

23. The overvoltage protection device of claim 21, further including a pair of buried regions, each having a respective breakdown junction, and said emitter region has formed therein a pair of said openings, each said breakdown junction laterally offset from a closed peripheral edge of a respective said emitter opening.

24. The overvoltage protection device of claim 21, wherein said emitter opening is circular shaped.

25. The overvoltage protection device of claim 24, wherein said breakdown junction is circular shaped.

26. The overvoltage protection device of claim 21, wherein said overvoltage protection device defines a first overvoltage protection device, and further including a second overvoltage protection device formed in said semiconductor material substantially identical to said first overvoltage protection device.

27. The overvoltage protection device of claim 15, wherein said buried region is formed with a breakdown junction having a breakover voltage of about 10 volts or less.

28. The overvoltage protection device of claim 2, wherein the peripheral edge of said emitter region includes an indented area, and at least a portion of said breakdown junction is laterally offset from said indented area.

29. The overvoltage protection device of claim 28, wherein said indented area is semicircular shaped.

30. The overvoltage protection device of claim 28, wherein said indented area is U-shaped.

31. The overvoltage protection device of claim 15, further including a plurality of buried regions, and wherein said buried regions are spaced around the peripheral lateral boundary of said emitter region so that carriers emitted from said buried regions during turn on are collected by substantially an entire lateral surface of said emitter region.

32. The overvoltage protection device of claim 15, wherein said emitter region is formed with at least two corners, and further including at least two buried regions each located laterally adjacent respective said corners of said emitter region.

33. The overvoltage protection device of claim 15, wherein said emitter region is formed with at least one indented area in said peripheral lateral boundary, and a top portion of one said buried region is located so as to be laterally adjacent said indented area.

34. The overvoltage protection device of claim 33, wherein said indented area has a shape substantially the same as a shape of said top portion of said buried region located adjacent thereto.

35. The overvoltage protection device of claim 15, further including an electrical isolation disposed between at least a portion of said base region and one said buried region to prevent current flow between the portion of said base region and said one buried region.

36. The overvoltage protection device of claim 35, wherein said electrical isolation comprises a trench formed in said base region, said trench filled with an electrical insulating material.

37. The overvoltage protection device of claim 15, further including an electrical isolation isolating at least a portion of the breakdown junction of one said buried region from at least a portion of said base region.

* * * * *